US008536057B2

(12) United States Patent
Lee et al.

(10) Patent No.: US 8,536,057 B2
(45) Date of Patent: Sep. 17, 2013

(54) THIN FILM DEPOSITION APPARATUS AND METHOD OF MANUFACTURING ORGANIC LIGHT EMITTING DEVICE BY USING THE SAME

(75) Inventors: Choong-Ho Lee, Yongin (KR); Yoon-Chan Oh, Yongin (KR); Jung-Min Lee, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 371 days.

(21) Appl. No.: 12/797,858

(22) Filed: Jun. 10, 2010

(65) Prior Publication Data

US 2010/0330712 A1    Dec. 30, 2010

(30) Foreign Application Priority Data

Jun. 25, 2009  (KR) ................... 10-2009-0057199

(51) Int. Cl.
 *H01L 21/44* (2006.01)
(52) U.S. Cl.
 USPC ............ 438/680; 438/22; 438/46; 438/99; 257/98; 257/E51.022; 257/E51.026
(58) Field of Classification Search
 USPC ........ 438/22, 46, 99, 680; 257/98, E51.022, 257/E51.026
 See application file for complete search history.

(56) References Cited

U.S. PATENT DOCUMENTS

| 6,274,198 | B1 | 8/2001 | Dautartas |
| 6,371,451 | B1 | 4/2002 | Choi |
| 6,749,906 | B2 | 6/2004 | Van Slyke |
| 7,015,154 | B2 | 3/2006 | Yamazaki et al. |

(Continued)

FOREIGN PATENT DOCUMENTS

| EP | 1 413 644 | | 4/2004 |
| EP | 1 418 250 | A2 | 5/2004 |

(Continued)

OTHER PUBLICATIONS

U.S. Appl. No. 13/031,756, filed Feb. 22, 2011, Yong Sup Choi et al., Samsung Mobile Display Co., Ltd.

(Continued)

*Primary Examiner* — Jarrett Stark
*Assistant Examiner* — Nicholas Tobergte
(74) *Attorney, Agent, or Firm* — Christie, Parker & Hale, LLP

(57) ABSTRACT

A thin film deposition apparatus and a method of manufacturing an organic light emitting device (OLED) using the thin film deposition apparatus. The thin film deposition apparatus includes a deposition source; a first nozzle in which a plurality of first slits are formed in one direction; a second nozzle in which a plurality of second slits are formed in the one direction; a second nozzle frame combined with the second nozzle to support the second nozzle; a first barrier wall assembly including a plurality of first barrier walls disposed in the one direction to form a space between the first nozzle and the second nozzle; and a second barrier wall assembly having a plurality of second barrier walls disposed in the one direction and a second barrier wall frame to support the second barrier walls, the second barrier wall assembly disposed at one side of the first barrier wall assembly, wherein the second barrier walls are mounted on the second barrier wall frame in the one direction and the second barrier walls slide on the second barrier wall frame.

9 Claims, 18 Drawing Sheets

(56) References Cited

U.S. PATENT DOCUMENTS

| | | | |
|---|---|---|---|
| 7,273,526 B2* | 9/2007 | Shinriki et al. | 118/715 |
| 7,677,195 B2* | 3/2010 | Lee et al. | 118/323 |
| 8,006,639 B2 | 8/2011 | Kim et al. | |
| 2001/0006827 A1 | 7/2001 | Yamazaki et al. | |
| 2002/0076847 A1 | 6/2002 | Yamada et al. | |
| 2002/0168577 A1 | 11/2002 | Yoon | |
| 2003/0101937 A1 | 6/2003 | Van Slyke et al. | |
| 2003/0168013 A1 | 9/2003 | Freeman et al. | |
| 2003/0221614 A1 | 12/2003 | Kang et al. | |
| 2004/0115339 A1 | 6/2004 | Ito | |
| 2004/0127066 A1 | 7/2004 | Jung | |
| 2004/0134428 A1 | 7/2004 | Sasaki et al. | |
| 2004/0142108 A1 | 7/2004 | Atobe et al. | |
| 2004/0144321 A1 | 7/2004 | Grace et al. | |
| 2004/0194702 A1 | 10/2004 | Sasaki et al. | |
| 2005/0016461 A1 | 1/2005 | Klug et al. | |
| 2005/0031836 A1 | 2/2005 | Hirai | |
| 2005/0037136 A1 | 2/2005 | Yamamoto | |
| 2005/0166842 A1 | 8/2005 | Sakamoto | |
| 2005/0257745 A1 | 11/2005 | Abiko et al. | |
| 2006/0144325 A1 | 7/2006 | Jung et al. | |
| 2006/0174829 A1 | 8/2006 | An et al. | |
| 2006/0205101 A1 | 9/2006 | Lee et al. | |
| 2007/0077358 A1 | 4/2007 | Jeong et al. | |
| 2007/0176534 A1 | 8/2007 | Abiko et al. | |
| 2007/0178708 A1 | 8/2007 | Ukigaya | |
| 2008/0018236 A1 | 1/2008 | Arai et al. | |
| 2008/0050521 A1* | 2/2008 | Ma et al. | 427/248.1 |
| 2008/0115729 A1 | 5/2008 | Oda et al. | |
| 2008/0131587 A1 | 6/2008 | Boroson et al. | |
| 2008/0216741 A1 | 9/2008 | Ling et al. | |
| 2009/0017192 A1 | 1/2009 | Matsuura | |
| 2009/0232976 A1 | 9/2009 | Yoon et al. | |
| 2010/0297348 A1* | 11/2010 | Lee et al. | 427/248.1 |
| 2011/0053301 A1 | 3/2011 | Kang et al. | |

FOREIGN PATENT DOCUMENTS

| | | |
|---|---|---|
| EP | 1 518 940 | 3/2005 |
| JP | 4-272170 | 9/1992 |
| JP | 2000-68054 | 3/2000 |
| JP | 2001-52862 | 2/2001 |
| JP | 2001-93667 | 4/2001 |
| JP | 2001-287328 | 10/2001 |
| JP | 2002-175878 | 6/2002 |
| JP | 2003-3250 | 1/2003 |
| JP | 2003-77662 | 3/2003 |
| JP | 2003-157973 | 5/2003 |
| JP | 2003-297562 | 10/2003 |
| JP | 2004-43898 | 2/2004 |
| JP | 2004-103269 | 4/2004 |
| JP | 2004-103341 | 4/2004 |
| JP | 2004-199919 | 7/2004 |
| JP | 2005-44592 | 2/2005 |
| JP | 2005-235568 | 9/2005 |
| JP | 2005-293968 | 10/2005 |
| JP | 2005-296737 | 10/2005 |
| JP | 2005-330551 | 12/2005 |
| JP | 2006-275433 | 10/2006 |
| JP | 2007-47293 | 2/2007 |
| JP | 2008-121098 | 5/2008 |
| JP | 2009-19243 | 1/2009 |
| JP | 2009-87910 | 4/2009 |
| KR | 10-0257219 | 2/2000 |
| KR | 10-2000-0019254 | 4/2000 |
| KR | 10-2000-0023929 | 5/2000 |
| KR | 10-2001-0059939 | 7/2001 |
| KR | 10-2002-0000201 | 1/2002 |
| KR | 10-2002-0050922 | 6/2002 |
| KR | 10-2002-0090934 | 12/2002 |
| KR | 10-2004-0034537 | 4/2003 |
| KR | 10-0405080 | 10/2003 |
| KR | 10-2003-0091947 | 12/2003 |
| KR | 10-2003-0093959 | 12/2003 |
| KR | 10-2004-0050045 | 6/2004 |
| KR | 10-2004-0069281 | 8/2004 |
| KR | 10-2004-0084747 | 10/2004 |
| KR | 10-0463212 | 12/2004 |
| KR | 10-0520159 | 9/2005 |
| KR | 10-2006-0008602 | 1/2006 |
| KR | 10-2006-0018745 | 6/2006 |
| KR | 10-2006-0073367 | 6/2006 |
| KR | 10-2006-0080475 | 7/2006 |
| KR | 10-2006-0080481 | 7/2006 |
| KR | 10-2006-0080482 | 7/2006 |
| KR | 10-2006-0083510 | 7/2006 |
| KR | 10-2006-0104675 | 10/2006 |
| KR | 10-2006-0104677 | 10/2006 |
| KR | 10-2006-0109627 | 10/2006 |
| KR | 10-0646160 | 11/2006 |
| KR | 10-0687007 | 2/2007 |
| KR | 10-2007-0025164 | 3/2007 |
| KR | 10-0696547 | 3/2007 |
| KR | 10-0698033 | 3/2007 |
| KR | 10-0700466 | 3/2007 |
| KR | 10-2007-0035796 | 4/2007 |
| KR | 10-0711885 | 4/2007 |
| KR | 10-2007-0050793 | 5/2007 |
| KR | 10-0723627 | 5/2007 |
| KR | 10-0726132 | 6/2007 |
| KR | 10-2007-0078713 | 8/2007 |
| KR | 10-2007-0080635 | 8/2007 |
| KR | 10-2007-0101842 | 10/2007 |
| KR | 10-2007-0105595 | 10/2007 |
| KR | 10-0770653 | 10/2007 |
| KR | 10-2008-0001184 | 1/2008 |
| KR | 10-0797787 | 1/2008 |
| KR | 10-0800125 | 1/2008 |
| KR | 10-0815265 | 3/2008 |
| KR | 10-0823508 | 4/2008 |
| KR | 10-0827760 | 4/2008 |
| KR | 10-0839380 | 6/2008 |
| KR | 10-2008-0060400 | 7/2008 |
| KR | 10-2008-0061132 | 7/2008 |
| KR | 10-2008-0062212 | 7/2008 |
| KR | 10-2008-0078290 | 8/2008 |
| KR | 10-2009-0038733 | 4/2009 |
| KR | 10-2009-0097453 | 9/2009 |

OTHER PUBLICATIONS

English-language abstract of Korean Publication No. KR 10-2002-0034272.

English-language abstract of Korean Publication No. KR 10-2002-0056238.

English-language abstract of Korean Publication No. KR 10-2002-0088662.

English-language abstract of Korean Publication No. KR 10-2005-0045619.

English-language abstract of Korean Publication No. KR 10-2006-0126267.

English-language abstract of Korean Publication No. KR 10-2008-0038650.

U.S. Appl. No. 12/784,774, filed May 21, 2010, Choong-Ho Lee et al., Samsung Mobile Display Co., Ltd.

U.S. Appl. No. 13/014,225, filed Jan. 26, 2011, Jong-Won Hong et al., Samsung Mobile Display Co., Ltd.

U.S. Appl. No. 12/836,760, filed Jul. 15, 2010, Jong-Heon Kim, et al., Samsung Mobile Display Co., Ltd.

U.S. Appl. No. 12/784,804, filed May 21, 2010, Choong-Ho Lee, et al., Samsung Mobile Display Co., Ltd.

U.S. Appl. No. 12/849,193, filed Aug. 3, 2010, Ji-Sook Oh et al., Samsung Mobile Display Co., Ltd.

U.S. Appl. No. 12/979,193, filed Dec. 28, 2010, Hyun Sook Park et al., Samsung Mobile Display Co., Ltd.

U.S. Appl. No. 12/820,355, filed Jun. 22, 2010, Yong-Sup Choi et al., Samsung Mobile Display Co., Ltd.

U.S. Appl. No. 12/950,361, filed Nov. 19, 2010, Choong-Ho Lee et al., Samsung Mobile Display Co., Ltd.

U.S. Appl. No. 12/795,896, filed Jun. 8, 2010, Jung-Min Lee, et al., Samsung Mobile Display Co., Ltd.

U.S. Appl. No. 12/856,942, filed Aug. 16, 2010, Yun-Mi Lee et al., Samsung Mobile Display Co., Ltd.

U.S. Appl. No. 12/814,816, filed Jun. 14, 2010, Jung-Min Lee et al., Samsung Mobile Display Co., Ltd.
U.S. Appl. No. 12/868,099, filed Aug. 25, 2010, Hee-Cheol Kang, et al., Samsung Mobile Display Co., Ltd.
U.S. Appl. No. 12/862,153, filed Aug. 24, 2010, Hoo-Cheol Kang, et al., Samsung Mobile Display Co., Ltd.
U.S. Appl. No. 12/869,830, filed Aug. 27, 2010, Chang-Mog Jo, et al., Samsung Mobile Display Co., Ltd.
U.S. Appl. No. 12/849,092, filed Aug. 3, 2010, Choong-Ho Lee et al., Samsung Mobile Display Co., Ltd.
U.S. Appl. No. 12/873,556, filed Sep. 1, 2010, Young-Mook Choi, et al., Samsung Mobile Display Co., Ltd.
U.S. Appl. No. 12/873,689, filed Sep. 1, 2010, Young-Mook Choi, et al., Samsung Mobile Display Co., Ltd.
U.S. Appl. No. 12/815,673, filed Jun. 15, 2010, Jung-Min Lee, Samsung Mobile Display Co., Ltd.
U.S. Appl. No. 12/794,093, filed Jun. 4, 2010, Jung-Min Lee et al., Samsung Mobile Display Co., Ltd.
U.S. Appl. No. 12/862,125, filed Aug. 24, 2010, Jae-Kwang Ryu et al., Samsung Mobile Display Co., Ltd.
U.S. Appl. No. 12/795,001, filed Jun. 7, 2010, Choong-Ho Lee et al., Samsung Mobile Display Co., Ltd.
U.S. Appl. No. 12/813,786, filed Jun. 11, 2010, Choong-Ho Lee et al,. Samsung Mobile Display Co., Ltd.
U.S. Appl. No. 12/820,270, filed Jun. 22, 2010, Jung-Min Lee et al., Samsung Mobile Display Co., Ltd.
U.S. Appl. No. 12/907,396, filed Oct. 19, 2010, Yong-Sup Choi, et al., Samsung Mobile Display Co., Ltd.
U.S. Appl. No. 12/987,569, filed Jan. 10, 2011, Yun-Mi Lee et al., Samsung Mobile Display Co., Ltd.
U.S. Appl. No. 12/984,289, filed Jan. 4, 2011, Jung-Yeong Kim et al., Samsung Mobile Display Co., Ltd.
KIPO Office action dated Aug. 1, 2011, for Korean Patent application 10-2009-0078171, 4 pages.
U.S. Office action dated Oct. 11, 2012, for cross reference U.S. Appl. No. 12/836,760 (22 pages).
U.S. Office action dated May 9, 2013, for cross reference U.S. Appl. No. 12/836,760, (12 pages).

* cited by examiner

THIN FILM DEPOSITION APPARATUS AND METHOD OF MANUFACTURING ORGANIC LIGHT EMITTING DEVICE BY USING THE SAME

CROSS-REFERENCE TO RELATED PATENT APPLICATION

This application claims the benefit of Korean Patent Application No. 10-2009-0057199, filed on Jun. 25, 2009, in the Korean Intellectual Property Office, the disclosure of which is incorporated herein in its entirety by reference.

BACKGROUND OF THE INVENTION

1. Field of the Invention

An aspect of the present invention relates to a thin film deposition apparatus and a method of manufacturing an organic light emitting device (OLED) by using the same, and more particularly, to a thin film deposition apparatus to form a fine pattern on a large-sized substrate and a method of manufacturing an OLED by using the same.

2. Description of the Related Art

A display device using an organic light emitting device (OLED) has a wide viewing angle, excellent contrast, and rapid response time and thus has recently been highlighted as a next generation display device.

In general, an OLED emits light when holes and electrons respectively injected from an anode and a cathode are recombined in an organic light emitting layer, thereby generating visible light. However, in this structure, it is difficult to obtain high light emission efficiency. Thus, in an OLED, other organic layers such as an electron injection layer, an electron transport layer, a hole transport layer, and a hole injection layer may be selectively disposed between the anode and the cathode along with the organic light emitting layer.

Moreover, electrodes, the organic light emitting layer, and the organic layer of the OLED may be formed using various methods including deposition. In order to manufacture an organic light emitting display device using deposition, a fine metal mask (FMM) having a pattern of a thin film to be formed is closely adhered to the surface of a substrate on which the thin film is to be formed, and a material for forming the thin film is deposited on the FMM, thereby forming a thin film having a predetermined pattern.

However, it is difficult to form a fine pattern of organic thin films and red, green, and blue luminous efficiency may vary according to the pattern and thickness of the organic thin films. Thus, there are limitations in improving luminous efficiency of an OLED.

In addition, while the size of current display devices is gradually increasing, it is difficult to pattern an organic thin film over a large area by using a conventional thin film deposition apparatus. Thus, it is difficult to manufacture a large-sized OLED having satisfactory driving voltage, current density, brightness, color purity, luminous efficiency, and life span.

SUMMARY OF THE INVENTION

An aspect of the present invention provides a thin film deposition apparatus to form a fine pattern on a large-sized substrate and a method of manufacturing an organic light emitting device (OLED) by using the apparatus.

According to an aspect of the present invention, there is provided a thin film deposition apparatus including: a deposition source; a first nozzle in which a plurality of first slits are formed in one direction, wherein the first nozzle is disposed at one side of the deposition source; a second nozzle in which a plurality of second slits are formed in the one direction, wherein the second nozzle is disposed to face the deposition source; a second nozzle frame combined with the second nozzle to support the second nozzle; a first barrier wall assembly comprising a plurality of first barrier walls disposed in the one direction so as to form a space between the first nozzle and the second nozzle; and a second barrier wall assembly comprising a plurality of second barrier walls disposed in the one direction and a second barrier wall frame combined with the second barrier walls to support the second barrier walls, the second barrier wall assembly being disposed at one side of the first barrier wall assembly, wherein the second barrier walls are mounted on the second barrier wall frame in the one direction, and the second barrier walls slide on the second barrier wall frame.

The thin film deposition apparatus may further include a sliding unit connected to the second barrier walls, wherein the second barrier wall frame comprises a slide guiding unit to facilitate movement of the sliding unit, and the second barrier walls slide due to the sliding unit.

The slide guiding unit may include a groove unit formed in the one direction and the sliding unit may include a protrusion corresponding to the groove unit.

According to another aspect of the present invention, the sliding unit may be connected at both ends of the second barrier walls.

The sliding unit and the second barrier walls may be connected to each other by a first elastic member so as to be combined to the second barrier wall frame while the second barrier walls are extended.

The first elastic member may include a folded flat type spring or a ring type spring.

The slide guiding unit may include a first contact surface contacting the sliding unit and the sliding unit may include a second contact surface contacting the first contact surface, wherein the first contact surface and the second contact surface may be flat.

The thin film deposition apparatus may further include a second elastic member interposed between the sliding unit and the slide guiding unit, wherein the second elastic member is disposed to be opposite to the second contact surface from among surfaces of the sliding unit.

According to another aspect of the present invention, the second elastic member may include a ball spring.

The thin film deposition apparatus may further include a micrometer disposed on the second barrier wall frame so as to control sliding movement of the second barrier walls.

The thin film deposition apparatus may further include a jig which connects the micrometer with the second barrier wall frame and is detachable from the second barrier wall frame, wherein the micrometer may be detached from the second barrier wall frame by using the jig.

The micrometer may be plural in number, so that there may be a micrometer disposed at either end or at both ends of the second barrier walls so as to control the sliding movement of both ends of the second barrier walls.

The second barrier wall frame may include a third contact surface contacting the second nozzle frame, the third contact surface being flat.

A line extending along and beyond the third contact surface may be respectively parallel to lines extending in a longitudinal direction of the second barrier walls.

The second nozzle frame may include a fourth contact surface formed as a flat surface from among surfaces contacting the second nozzle and wherein the third contact surface and the fourth contact surface are parallel to each other.

The plurality of first barrier walls may be respectively formed to be substantially perpendicular to the one direction so as to partition a space between the first nozzle and the second nozzle.

At least one first slit of the plurality of first slits may be interposed between each two adjacent first barrier walls from among the plurality of first barrier walls.

At least two second slits of the plurality of second slits may be interposed between two adjacent first barrier walls from among the plurality of first barrier walls.

The number of second slits disposed between each two adjacent first barrier walls may be greater than the number of first slits disposed between each two adjacent first barrier walls.

According to another aspect of the present invention, the total number of second slits may be greater than the total number of first slits.

The first barrier wall assembly may be spaced apart from the first nozzle.

The plurality of second barrier walls may be formed to be substantially perpendicular to the one direction so as to partition a space between the first nozzle and the second nozzle.

The plurality of first barrier walls and the plurality of second barrier walls may be disposed to respectively correspond to each other.

The first barrier walls and the second barrier walls which correspond to each other may be substantially disposed on the same plane.

The thicknesses of the first barrier walls in the one direction may be greater than the thicknesses of the second barrier walls in the one direction.

The plurality of first barrier walls and the plurality of second barrier walls may be respectively spaced apart from each other at equal intervals.

The plurality of first barrier walls and the plurality of second barrier walls may be formed to be spaced apart from each other.

The second barrier walls may be spaced apart from the second nozzle by a predetermined interval.

According to another aspect of the present invention, the thin film deposition apparatus may be disposed in a vacuum chamber.

The second nozzle may be spaced apart from a target on which deposition is performed and deposition materials vaporized in the deposition source are deposited on the target on which deposition is performed.

The width of the second nozzle in the one direction may be substantially the same as the width of the target on which deposition is performed.

The second nozzle frame may provide a predetermined tensile force to the second nozzle.

The temperature of the second nozzle frame may be substantially constant during a deposition process.

The first barrier wall assembly may further include a first cooling member.

The first cooling member may include a cooling fin protruding from an outer surface of the first barrier wall assembly.

The second barrier wall assembly may further include a second cooling member.

The second cooling member may include a cooling fin protruding from an outer surface of the second barrier wall assembly.

The thin film deposition apparatus may further include a radiation fin disposed in the second nozzle frame.

The thin film deposition apparatus may further include a thermal shield interposed between the deposition source and the second nozzle frame.

According to another aspect of the present invention, there is provided a method of manufacturing an organic light emitting device (OLED) by using a thin film deposition apparatus including: a deposition source; a first nozzle in which a plurality of first slits are formed in one direction, the first nozzle being disposed at one side of the deposition source; a second nozzle in which a plurality of second slits are formed in the one direction, the second nozzle being disposed to face the deposition source; a second nozzle frame combined with the second nozzle to support the second nozzle; a first barrier wall assembly including a plurality of first barrier walls disposed in the one direction so as to form a space between the first nozzle and the second nozzle; and a second barrier wall assembly including a plurality of second barrier walls disposed in the one direction and a second barrier wall frame, the second barrier walls being mounted on the second barrier wall frame, the second barrier wall assembly being disposed at one side of the first barrier wall assembly, the method including: preparing a substrate on which first electrodes are formed; forming an intermediate layer comprising an organic light emitting layer by using the thin film deposition apparatus, so that the intermediate layer is connected to the first electrodes formed on the substrate; and forming second electrodes on the intermediate layer.

The thin film deposition apparatus continuously may move in a direction perpendicular to the one direction so as to form the intermediate layer.

The forming of the intermediate layer may be performed while the second nozzle of the thin film deposition apparatus is spaced apart from the substrate by a predetermined interval.

The width of the second nozzle of the thin film deposition apparatus in the one direction may be substantially the same as the width of the substrate in the one direction.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE EMBODIMENTS

Figure 1:
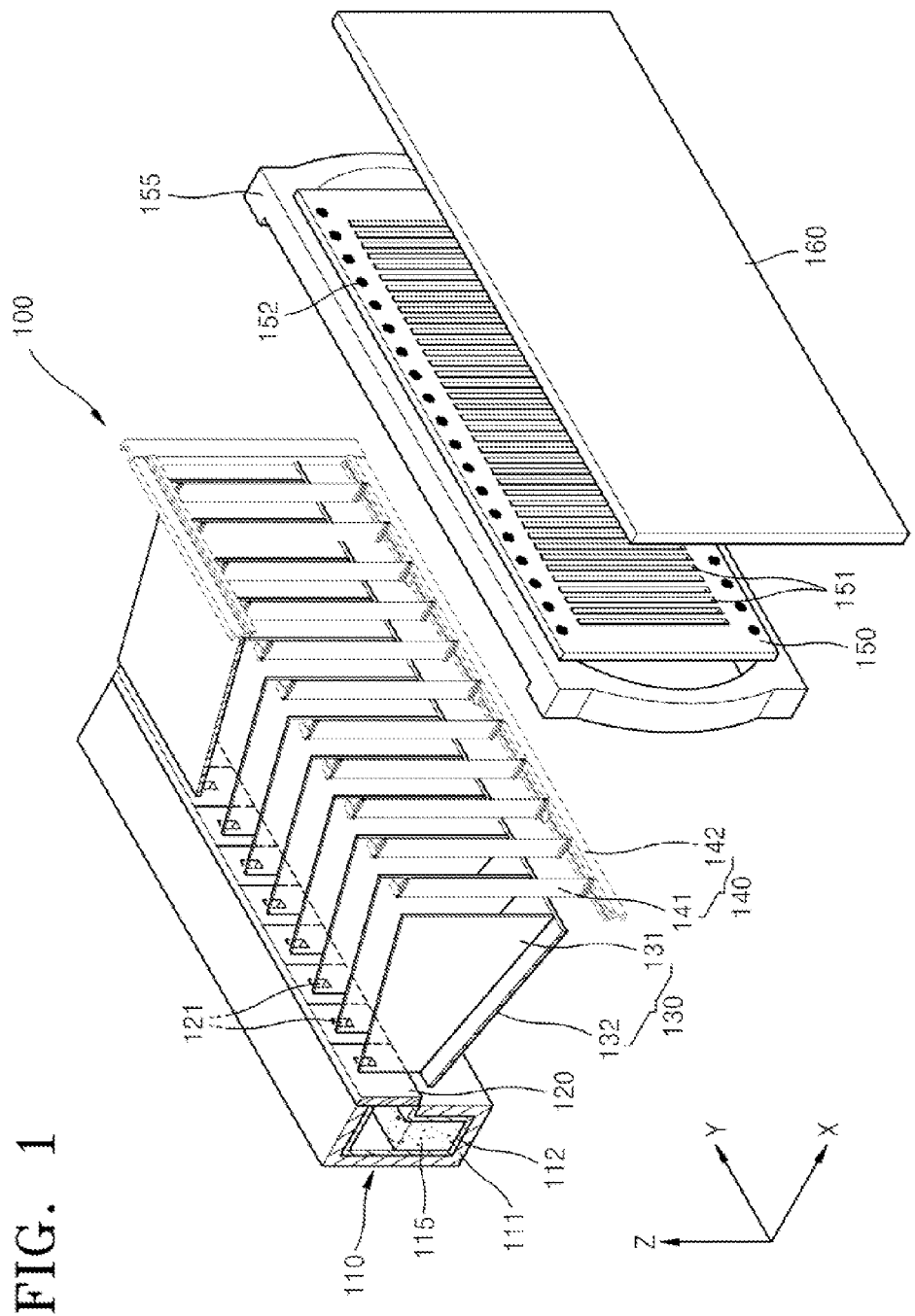
FIG. 1 is a perspective view schematically illustrating a thin film deposition apparatus, according to an embodiment of the present invention.

Reference will now be made in detail to the present embodiments of the present invention, examples of which are illustrated in the accompanying drawings, wherein like reference numerals refer to the like elements throughout. The embodiments are described below in order to explain the present invention by referring to the figures. Moreover, it is to be understood that where is stated herein that one film or layer is "formed on" or "disposed on" a second layer or film, the first layer or film may be formed or disposed directly on the second layer or film or there may be intervening layers or films between the first layer or film and the second layer or film. Further, as used herein, the term "formed on" is used with the same meaning as "located on" or "disposed on" and is not meant to be limiting regarding any particular fabrication process.

Figure 2:
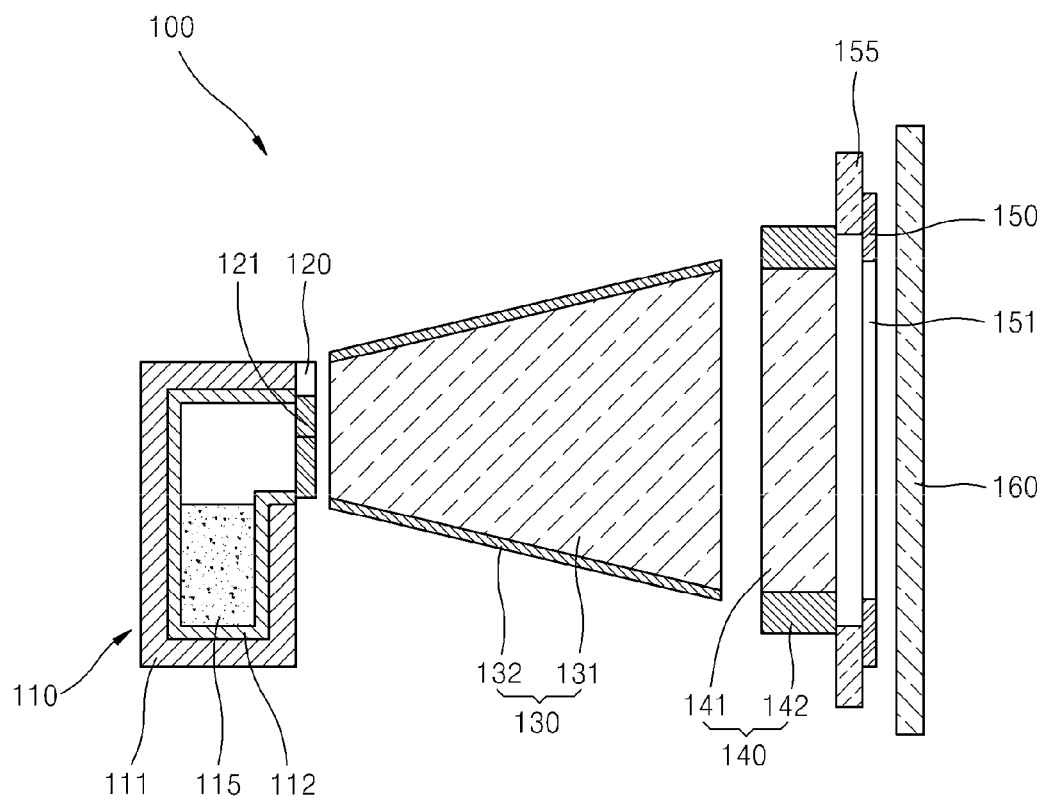
FIG. 2 is a side sectional view schematically illustrating the thin film deposition apparatus of FIG. 1, according to an embodiment of the present invention.

FIG. 1 is a perspective view schematically illustrating a thin film deposition apparatus 100 according to an embodiment of the present invention; FIG. 2 is a side view schematically illustrating the thin film deposition apparatus 100; and FIG. 3 is a plan view schematically illustrating the thin film deposition apparatus 100 of FIG. 1.

Figure 3:
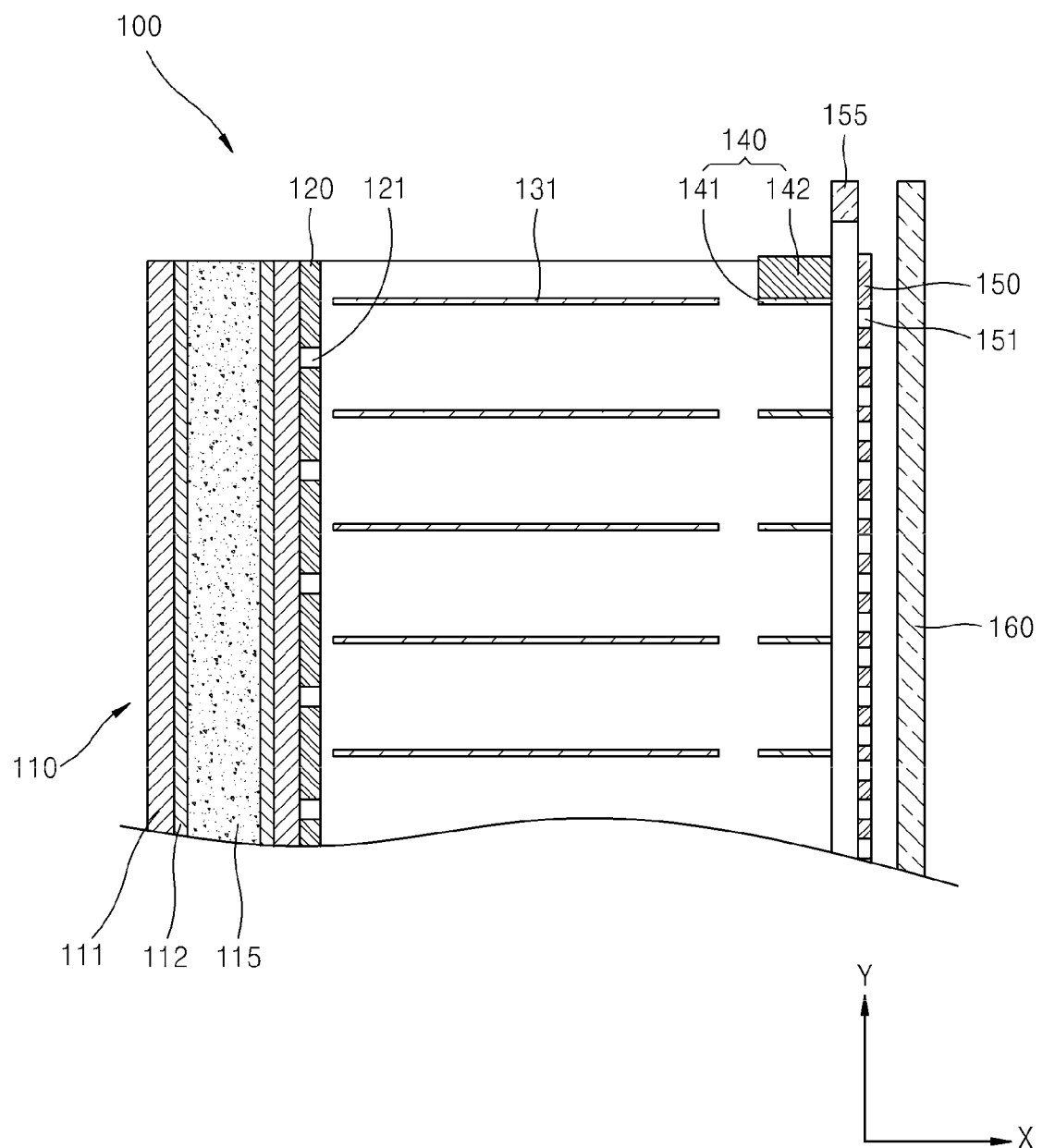
FIG. 3 is a plan view schematically illustrating the thin film deposition apparatus of FIG. 1, according to an embodiment of the present invention.

Referring to FIGS. 1, 2, and 3, the thin film deposition apparatus 100 according to an embodiment of the present invention includes a deposition source 110 containing a deposition material 115 to be deposited onto a substrate 160, a first nozzle 120, a first barrier wall assembly 130, a second barrier wall assembly 140, a second nozzle 150, and a second nozzle frame 155. The second barrier wall assembly 140 includes a second barrier wall 141 and a second barrier wall frame 142.

Although a chamber is not illustrated in FIGS. 1, 2, and 3 for convenience of description, all structures of FIGS. 1, 2, and 3 may be arranged in a chamber in which an appropriate degree of vacuum is maintained and thus the deposition material 115 may be emitted in one direction.

More specifically, in order to deposit the deposition material 115 discharged from the deposition source 110 onto the substrate 160 in a desired pattern by passing through the first nozzle 120 and the second nozzle 150, a high-vacuum state may be maintained inside the chamber (not illustrated) as in a fine metal mask (FMM) deposition method. Also, if temperatures of the first barrier wall assembly 130, the second barrier wall assembly 140, and the second nozzle 150 are sufficiently lower than a temperature of the deposition source 110, a space between the first nozzle 120 and the second nozzle 150 may be maintained in a high-vacuum state. In this regard, the temperatures of the first barrier wall assembly 130, the second barrier wall assembly 140 and the second nozzle 150 may be about 100° C. or less. Accordingly, as the temperatures of the first barrier wall assembly 130, the second barrier wall assembly 140, and the second nozzle 150 are sufficiently low, the deposition material 115 that would otherwise be discharged in a non-desired direction, are adsorbed onto the first barrier wall assembly 130 and the second barrier wall assembly 140 so as to maintain a high-vacuum state. Thus, the deposition material 115 is discharged in a straight direction and particles thereof do not collide with each other. The first barrier wall assembly 130 faces the deposition source 110 which is at a relatively high temperature. The temperature around the deposition source 110 may increase by about 85° C. and thus a partial cooling device may be further included, if necessary. Accordingly, a cooling device such as a cooling fin which may be plural in number may be formed in the first barrier wall assembly 130 and/or on the second barrier wall assembly 140.

The substrate 160, on which deposition is performed, is disposed in the chamber (not illustrated). The substrate 160 may be a substrate for a flat panel display device and may be a large-sized substrate, such as a mother glass, for manufacturing a plurality of flat panel displays.

The deposition source 110, in which the deposition material 115 is contained and heated, is disposed to face the substrate 160 in the chamber. As the deposition material 115 contained in the deposition source 110 is vaporized, the deposition material 115 is deposited on the substrate 160. More specifically, the deposition source 110 includes a crucible 111 and a heater 112, wherein the crucible 111 is filled with the deposition material 115 and the heater 112 heats the crucible 111 so as to vaporize the deposition material 115 filled in the crucible 111 towards a side of the crucible 111, for example, to the first nozzle 120.

The first nozzle 120 is disposed at a side of the deposition source 110, more specifically, the side of the deposition source 110 facing the substrate 160. The first nozzle 120 includes a plurality of first slits 121 arranged in a Y-axis direction at equal intervals. The deposition material 115 that is vaporized in the deposition source 110 passes through the first nozzle 120 towards the substrate 160.

The first barrier wall assembly 130 is disposed at a side of the first nozzle 120. The first barrier wall assembly 130 includes a plurality of first barrier walls 131 and a first barrier wall frame 132 that constitutes an outer wall of the first barrier walls 131. Here, the plurality of first barrier walls 131 may be arranged at equal intervals in the Y-axis direction. In addition, the plurality of first barrier walls 131 may be formed to extend along a XZ plane, that is, perpendicular to the Y-axis direction. The plurality of first barrier walls 131 partition the space between the first nozzle 120 and the second nozzle 150. In the thin film deposition apparatus 100 according to an embodiment of the present invention, the deposition space is divided by each of the plurality of first barrier walls 131 into sub-deposition spaces that respectively correspond to the first slits 121 through which the deposition material 115 is ejected.

Here, each of the plurality of first barrier walls 131 may be interposed between adjacent first slits 121. In other words, one first slit 121 may be interposed between two adjacent first barrier walls 131. The first slits 121 may be respectively disposed at the midpoint between adjacent first barrier walls 131. Accordingly, since the first barrier walls 131 form a space between the first nozzle 120 and the second nozzle 150, the deposition material 115 discharged through each first slit 121 is not mixed with the other deposition material 115 discharged through the other slits 121 and passes through second slits 151 so as to be deposited on the substrate 160. In other words, the first barrier walls 131 guide the deposition material 115, which is discharged through the first slits 121, so as not to flow in the Y-axis direction.

Moreover, the first barrier wall frame 132 may be formed on an outer side of the first barrier walls 131. The first barrier wall frame 132 is respectively formed on upper and lower surfaces of the plurality of first barrier walls 131 and supports the plurality of first barrier walls 131. Also, the first barrier wall frame 132 guides the deposition material 115, which is discharged through the first slits 121, so as not to flow in a Z-axis direction.

The first barrier wall assembly 130 may be detachable from the thin film deposition apparatus 100. Accordingly, as illustrated in FIG. 1, the first barrier wall assembly 130 may be spaced apart from the first nozzle 120.

A conventional FMM deposition method has low deposition efficiency. Here, deposition efficiency denotes the amount of a material actually deposited on a substrate relative to all material vaporized in a deposition source. The conventional FMM deposition method has a deposition efficiency of about 32%. Moreover, about 68% of organic materials that are not used in the deposition are deposited anywhere in a deposition device in the conventional FMM deposition method, making it difficult to reuse the organic materials.

Accordingly, in the thin film deposition apparatus 100 according to an embodiment of the present invention, a deposition space is enclosed using the first barrier wall assembly 130 and thus the deposition material 115 that is not deposited on the substrate 160 is mostly deposited in the first barrier wall assembly 130. Thus, when the deposition material 115 is largely deposited on the first barrier wall assembly 130 after a long deposition process, the first barrier wall assembly 130 may be detached from the thin film deposition apparatus 100 and may be inserted into a separate deposition material recycling device, thereby recovering the deposition material 115. Therefore, recycling rate of the deposition material 115 increases so that the deposition efficiency may increase and manufacturing costs may be reduced.

Also, since the first barrier wall assembly 130 is separated from the first nozzle 120, a temperature increase in the first barrier wall assembly 130 due to heat transfer to the first barrier wall assembly 130 may be suppressed. In addition, since the first barrier wall assembly 130 is separated from the first nozzle 120, a space is provided for installing a member (not illustrated) for blocking radiant heat of the first nozzle 120. More specifically, a space is provided for a member for blocking radiant heat around the first slits 121 in the first nozzle 120.

The separation distance between the first barrier wall assembly 130 and the first nozzle 120, may be set according to processing conditions.

The second barrier wall assembly 140 is disposed at a side of the first barrier wall assembly 130. The second barrier wall assembly 140 includes a plurality of second barrier walls 141 and a second barrier wall frame 142 that constitutes an outer wall of the second barrier walls 141.

Here, the plurality of second barrier walls 141 may be arranged parallel to each other at equal intervals in the Y-axis direction. In addition, the plurality of second barrier walls 141 may be formed to extend in a XZ plane, that is, perpendicular to the Y-axis direction. The plurality of second barrier walls 141 partition the space between the first nozzle 120 and the second nozzle 150. The combination relationship between the second barrier walls 141 and the second barrier wall frame 142 will be described later.

In the thin film deposition apparatus 100 according to an embodiment of the present invention, the deposition space is divided by the plurality of first barrier walls 131 and the plurality of second barrier walls 141 into sub-deposition spaces that respectively correspond to the first slits 121 through which the deposition material 115 is ejected.

The second barrier wall frame 142 may be formed in a lattice shape, similar to a window frame, and the plurality of second barrier walls 141 are disposed in the second barrier wall frame 142. The second barrier wall frame 142 supports the plurality of second barrier walls 141 and guides the deposition material 115, which is discharged through the first slits 121, not to flow in the Z-axis direction.

The first barrier wall assembly 130 and the second barrier wall assembly 140 are used to form the space between the first nozzle 120 and the second nozzle 150. However, the embodiments of the present invention are not limited thereto. Only the first barrier wall assembly 130 may be used to form the space between the first nozzle 120 and the second nozzle 150. In other words, the second barrier wall assembly 140 may not be included. However, when both the first barrier wall assembly 130 and the second barrier wall assembly 140 are included, the space between the first nozzle 120 and the second nozzle 150 may be formed more efficiently, compared to when only the first barrier wall assembly 130 is used.

Referring to FIGS. 1 through 3, the plurality of second barrier walls 141 may be arranged to respectively correspond to the plurality of first barrier walls 131. In other words, the second barrier walls 141 may be respectively arranged to be parallel with the first barrier walls 131. That is, pairs of first barrier walls 131 and second barrier wall 141, which correspond to each other, are disposed on the same plane. Accordingly, since the space between the first nozzle 120 and the second nozzle 150 is partitioned by the first barrier walls 131 and the second barrier walls 141 that correspond to each other, the deposition material 115 discharged through one first slit 121 is not mixed with the other deposition material 115 discharged through the other first slits 121 and passes through the second slits 151 so as to be deposited on the substrate 160. In other words, the first barrier walls 131 and the second barrier walls 141 guide the deposition material 115, which is discharged through the first slits 121, not to flow in the Y-axis direction.

In the drawings, the thickness of the first barrier walls 131 is the same as that of the second barrier walls 141 in the Y-axis direction; however, the aspects of the present invention are not limited thereto. That is, the second barrier walls 141 which need to be accurately aligned with the second nozzle 150 may be formed to be relatively thin, whereas the first barrier walls 131 do not need to be accurately aligned with the second nozzle 150 and thus may be formed to be relatively thick. This makes it easier to manufacture the thin film deposition apparatus 100.

The second nozzle 150 and the second nozzle frame 155 are disposed between the deposition source 110 and the substrate 160. The second nozzle frame 155 may be formed in a lattice shape, similar to a window frame, and the second nozzle 150 is disposed inside the second nozzle frame 155. Also, the plurality of second slits 151 are disposed in the second nozzle 150 at regular intervals in the Y-axis direction. The deposition material 115 vaporized in the deposition source 110 passes through the first nozzle 120 and the second nozzle 150 towards the substrate 160.

Here, in the thin film deposition apparatus 100, the number of second slits 151 may be greater than the number of first slits 121. Also, there may be a greater number of second slits 151 than the first slits 121 interposed between two adjacent first barrier walls 131.

That is, one or more first slits 121 are interposed between two adjacent first barrier walls 131. Simultaneously, a plurality of second slits 151 are interposed between two adjacent first barrier walls 131. In addition, the space between the first nozzle 120 and the second nozzle 150 is partitioned by the adjacent first barrier walls 131 into sub-deposition spaces that correspond to the first slits 121. Accordingly, the deposition material 115 discharged from each first slit 121 mostly passes through a plurality of second slits 151 disposed in the sub-deposition space corresponding to the first slit 121, and is deposited on the substrate 160.

In the drawings, three second slits 151 are disposed to correspond to each first slit 121; however, the aspects of the present invention are not limited thereto. The ratio of the number of first slits 121 to the number of second slits 151 may vary according to the requirements of a product to be manufactured.

Moreover, the second nozzle 150 may be manufactured by using etching, which is the same as a conventional method of manufacturing a FMM, specifically, a stripe type mask. In the conventional FMM deposition method, the size of the FMM is the same as the size of a substrate. Accordingly, as the size of the substrate increases, the size of the FMM has to be increased. Thus, it is difficult to manufacture an FMM and to extend the FMM to be aligned with a fine pattern.

However, in the thin film deposition apparatus 100, a thin layer is deposited while the thin film deposition apparatus 100 is moved in the Z-axis direction within the chamber (not shown). In other words, when the thin film deposition apparatus 100 has completed deposition at a current position, the thin film deposition apparatus 100 or the substrate 160 is moved in the Z-axis direction and thus deposition is further performed. Accordingly, in the thin film deposition apparatus 100, the second nozzle 150 may be significantly smaller than a FMM used in a conventional deposition method. That is, in the thin film deposition apparatus 100, when the width of the second nozzle 150 in the Y-axis direction is the same as the width of the substrate 160 in the Y-axis direction, the length of the second nozzle 150 in the Z-axis direction may be less than the length of the substrate 160. Since the second nozzle 150 may be formed to be significantly smaller than an FMM used in a conventional deposition method, it is relatively easy to manufacture the second nozzle 150. In other words, using the second nozzle 150, which is smaller than a FMM used in a conventional deposition method, is more convenient in all processes, including etching and subsequent other processes, such as precise extension, welding, moving, and cleaning processes, compared to the conventional deposition method using the larger FMM. This is more advantageous for a relatively large display device.

Figure 4:
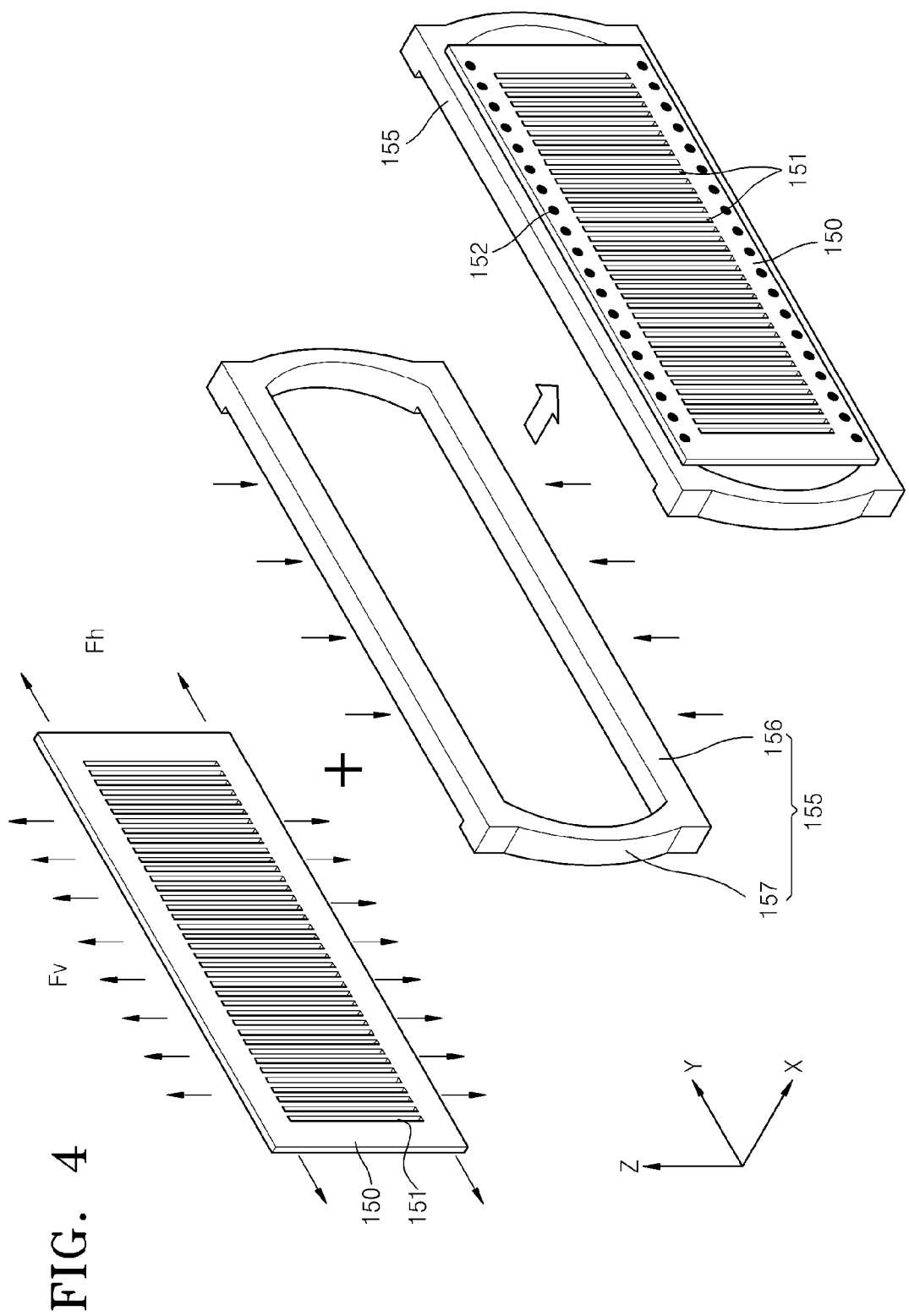
FIG. 4 is a detailed perspective view of a second nozzle frame and a second nozzle included in the thin film deposition apparatus of FIG. 1, according to an embodiment of the present invention.

FIG. 4 is a detailed perspective view of the second nozzle frame 155 and the second nozzle 150 included in the thin film deposition apparatus 100, according to an embodiment of the present invention. In FIG. 4, the combination relationship between the second nozzle 150 and the second nozzle frame 155 is schematically illustrated.

The second nozzle 150 may be formed of a thin film and may be fixed to the thin film deposition apparatus by the second nozzle frame 155.

Referring to FIG. 4, the second nozzle frame 155 may be formed in a lattice shape, similar to a window frame, and the second nozzle 150 in which the plurality of second slits 151 are formed is bound inside the second nozzle frame 155. In the manufacture of the thin film deposition apparatus 100, the second nozzle 150 and the second nozzle frame 155 are combined with each other such that the second nozzle frame 155 exerts a predetermined tensile force on the second nozzle 150.

More specifically, the precision of the second nozzle 150 may be affected by errors in manufacturing the second nozzle 150 and errors due to thermal expansion of the second nozzle 150 during the deposition. In order to reduce the manufacturing errors, a counter force technique used to precisely extend a FMM and weld it to a frame may be used. The counter force technique is described more fully as follows. Referring to FIG. 4, an external tensile force is applied to the second nozzle 150 so that the second nozzle 150 is stretched outwards. Then, a compressive force is applied to the second nozzle frame 155 in an opposite direction, so that the compressive force and the external tensile force applied to the second nozzle 150 may be in equilibrium.

Then, the second nozzle 150 is combined with the second nozzle frame 155 by welding edges of the second nozzle 150 to the second nozzle frame 155. In FIG. 4, the second nozzle 150 and the second nozzle frame 155 are combined with each other by weld points 152.

Finally, when the external tensile force acting on the second nozzle 150 is removed, a tensile force is applied to the second nozzle 150 by the second nozzle frame 155. Although there may be etching dispersion when such precision tensile/compression/welding techniques are used, the second nozzle 150 may be manufactured with a manufacturing error of 2 μm or less.

Moreover, in the thin film deposition apparatus 100, the temperature of the second nozzle frame 155 may be maintained constant. More specifically, the second nozzle 150 is disposed to face the high-temperature deposition source 110 and thus is always affected by radiant heat, thereby increasing the temperature of the second nozzle 150 to some degree (by about 5 to 15° C.). As such, when the temperature of the second nozzle 150 increases, the second nozzle 150 expands and thus pattern precision may be reduced.

Accordingly, the second nozzle 150 is a stripe type nozzle and the temperature of the second nozzle frame 155, which supports the second nozzle 150 such that a tensile force is exerted on the second nozzle 150, is maintained constant, thereby preventing pattern errors due to a temperature increase of the second nozzle 150.

The thermal expansion (pattern error) of the second nozzle 150 in a horizontal direction (Y-axis direction) is determined by the temperature of the second nozzle frame 155. Thus, if the temperature of the second nozzle frame 155 is constant, pattern errors due to the thermal expansion do not occur, even if the temperature of the second nozzle 150 increases. Moreover, the second nozzle 150 thermally expands in the Z-axis direction; however, such a direction is a scan direction and thus such thermal expansion is not related to the pattern precision.

The second nozzle frame 155 does not directly face the deposition source 110 in a vacuum state and thus is not affected by radiant heat. Also, since the second nozzle frame 155 is not connected to the deposition source 110, there is no thermal conduction therebetween. Thus, there is no possibility of increasing the temperature of the second nozzle frame 155. Even if there is a slight increase in temperature (1 to 3° C.) of the second nozzle frame 155, a thermal shield or a radiation fin may be used to easily maintain a constant temperature.

As such, while the second nozzle frame 155 provides a predetermined tensile force to the second nozzle 150, the temperature of the second nozzle frame 155 is maintained constant so that the thermal extension problem with the second nozzle 150 no longer affects a problem of pattern precision of the second nozzle 150. Thus, the pattern precision of the second nozzle 150 may be improved. That is, as described above, although there may be etching dispersion when the precision tensile/compression/welding techniques are used, the second nozzle 150 may be manufactured with a manufacturing error of 2 μm or less. Also, since a tensile force is provided to the second nozzle 150 and the temperature of the second nozzle frame 155 is maintained constant, thermal expansion errors due to the temperature increase in the second nozzle 150 do not occur. Thus, the second nozzle 150 may be manufactured with an error of less than 2 μm, which is attributed to a manufacturing error (<2) of the second nozzle 150 and a thermal expansion error (~0) of the second nozzle 150.

Figure 5:
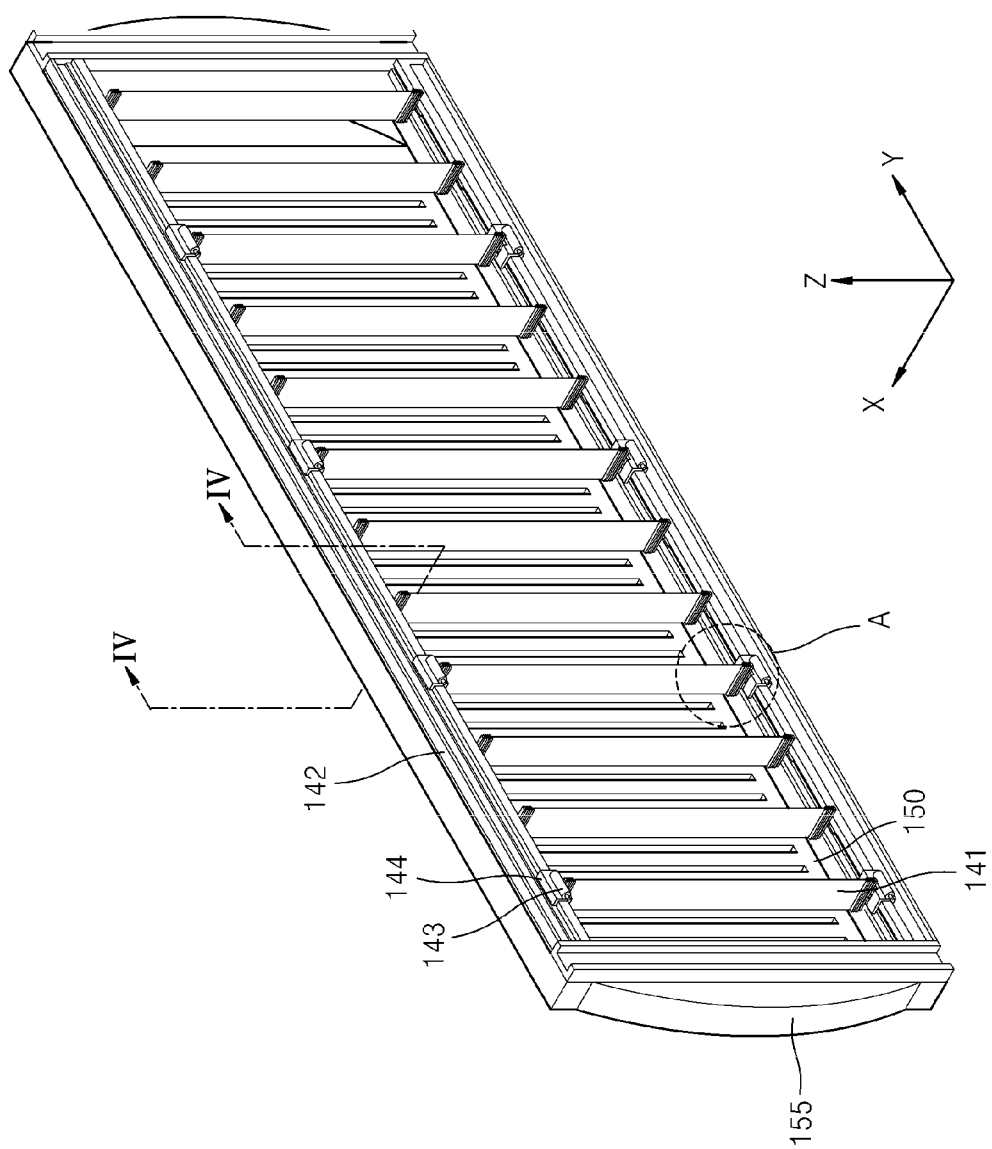
FIG. 5 is a detailed perspective view of second barrier walls and a second barrier wall frame included in the thin film deposition apparatus of FIG. 1, according to an embodiment of the present invention.
Figure 6:
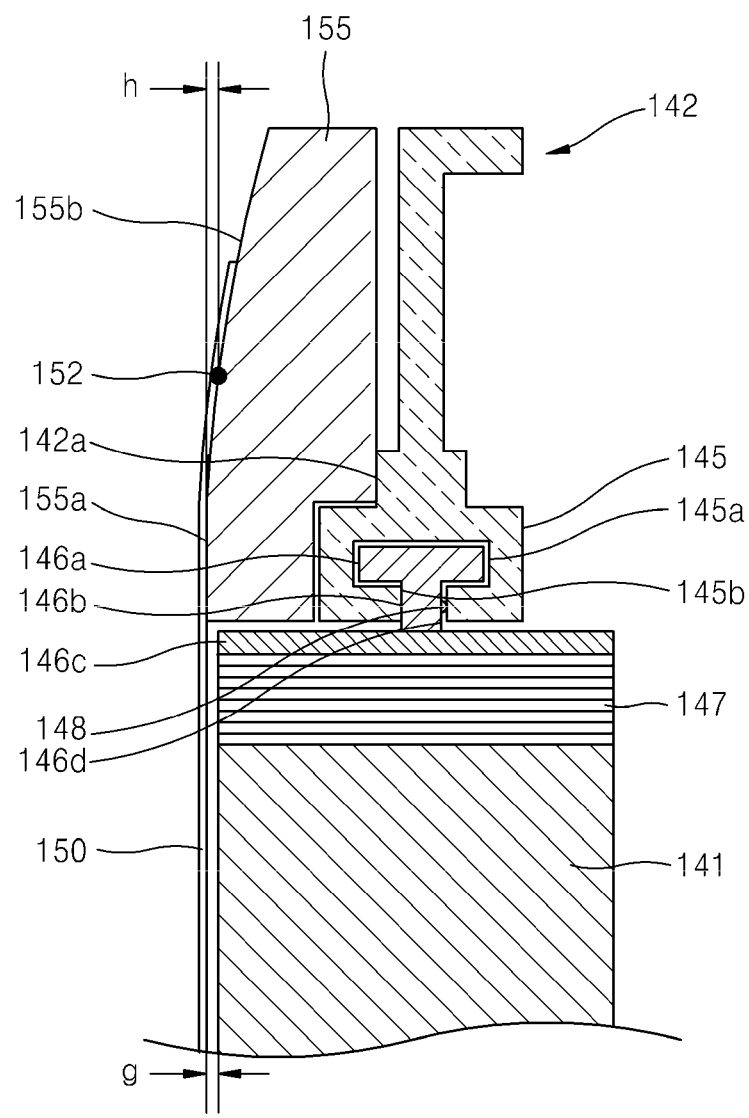
FIG. 6 is a cross-sectional view of the second barrier wall and the second barrier wall frame of FIG. 5 taken along a line VI-VI of FIG. 5, according to an embodiment of the present invention.
Figure 7:
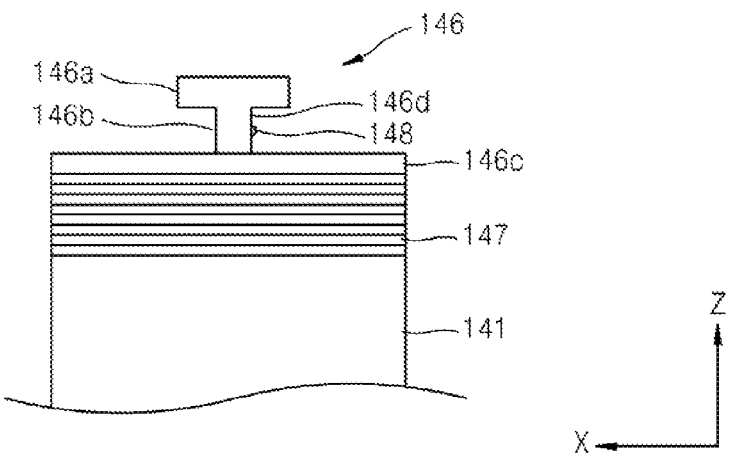
FIG. 7 is an enlarged view of the second barrier wall of FIG. 6 and a sliding unit, according to an embodiment of the present invention.
Figure 8:
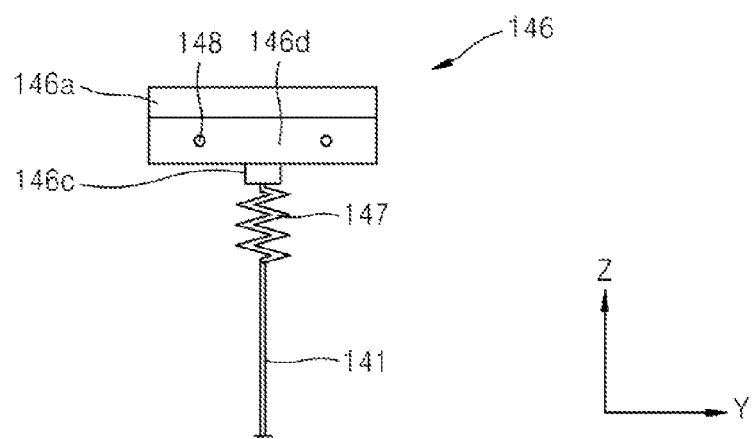
FIG. 8 is a side view of the second barrier wall and sliding unit of FIG. 7, according to an embodiment of the present invention.
Figure 9:
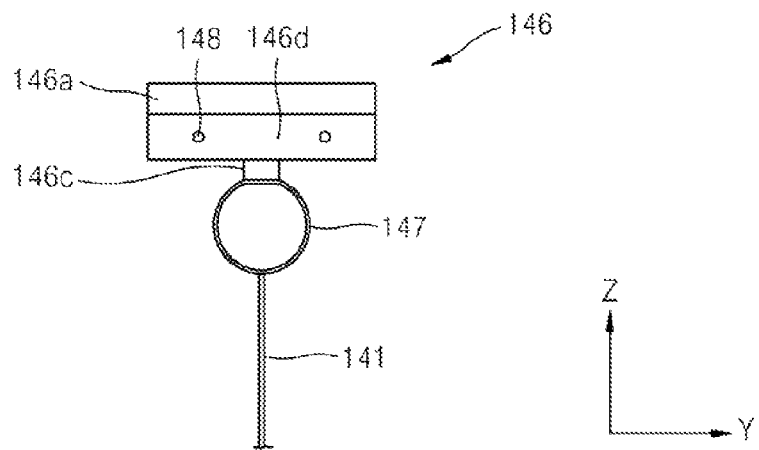
FIG. 9 is a modified example of FIG. 8, according to an embodiment of the present invention.

FIG. 5 is a detailed perspective view of the second barrier walls 141 and the second barrier wall frame 142 included in the thin film deposition apparatus 100, according to an embodiment of the present invention; FIG. 6 is a cross-sectional view of the second barrier wall 141 and the second barrier wall frame 142 of FIG. 5 taken along a line VI-VI of FIG. 5; FIG. 7 is an enlarged view of the second barrier wall 141 of FIG. 6 and a sliding unit 146; FIG. 8 is a side view of the second barrier wall 141 and the sliding unit 146 of FIG. 7; and FIG. 9 is a modified example of FIG. 8.

FIG. 5 is a detailed perspective view illustrating the second barrier wall frame 142, the second barrier walls 141, the second nozzle frame 155, and the second nozzle 150, which are combined with each other and viewed from the deposition source 110 of FIG. 1 for convenience of description.

The second nozzle frame 155 and the second barrier wall frame 142 are aligned with each other and then are combined by a combining member. For stability of combination and reduction in deformation, the second nozzle frame 155 and the second barrier wall frame 142 may be combined by a protrusion and a connecting hole (not illustrated).

The second barrier wall frame 142 includes micrometers 143 for controlling minute movement of the second barrier walls 141 (details thereof will be described later).

As described above, the plurality of second barrier walls 141 partition a space between the first nozzle 120 and the second nozzle 150 and may not cover the second slits 151 of the second nozzle 150. That is, since the deposition material 115 is deposited on the substrate 160 through the second slits 151 of the second nozzle 150, the plurality of second barrier walls 141 may be precisely aligned in order for the deposition material 115 to be deposited on the substrate 160 in a desired pattern.

Thus, the plurality of second barrier walls 141 may be slid while not being separated from the second barrier wall frame 142. That is, the second barrier walls 141 are mounted on the second barrier wall frame 142, and the second barrier walls 141 slide on the second barrier wall frame 142.

More specifically, referring to FIGS. 5, 6, and 7, the sliding units 146 are disposed at both ends of the second barrier walls 141. In this regard, the second barrier wall frame 142 includes a slide guiding unit 145. The second barrier walls 141 are mainly formed of a metal thin film and flatness thereof is important. In order to improve the flatness of the second barrier walls 141, the second barrier walls 141 and the sliding units 146 may be connected to each other by a first elastic member 147. A detailed description thereof will be provided later.

The slide guiding unit 145 includes a groove unit 145a which has a long extended form so as for the sliding unit 146 to move in a straight line. The groove unit 145a extends in the Y-axis direction. That is, as illustrated in FIG. 6, the cross-section of the slide guiding unit 145 has a C-like shape.

The sliding unit 146 includes a protrusion 146a which corresponds to the groove unit 145a. The protrusion 146a is shaped and sized so as to move in a straight line in the groove unit 145a. That is, the size of the protrusion 146a may be smaller than that of the groove unit 145a. However, when the protrusion 146a is moved while the protrusion 146a is spaced too far apart from the groove unit 145a, movement of the sliding unit 146 is non-uniform and consequently, precision sliding movement of the second barrier walls 141 may not be possible.

Accordingly, the slide guiding unit 145 and the sliding unit 146 contact each other. A first contact surface 145b of the slide guiding unit 145 contacts a second contact surface 146b of the sliding unit 146. The first contact surface 145b and the second contact surface 146b have flat surfaces. Thus, the sliding unit 146 may easily move in a straight line in the slide guiding unit 145.

In addition, a second elastic member 148 is interposed between the sliding unit 146 and the slide guiding unit 145, and more specifically, is disposed on a surface 146d opposite to the second contact surface 146b from among the surfaces of the sliding unit 146. A predetermined pressure is applied between the sliding unit 146 and the slide guiding unit 145 by the second elastic member 148 so that the sliding unit 146 may slide in a straight line and non-uniform slide movement is prevented, thereby minutely controlling the movement of the sliding unit 146.

The second elastic member 148 interposed between the sliding unit 146 and the slide guiding unit 145 may be in any form that provides a predetermined pressure and may be a ball spring.

As described above, the sliding unit 146 and the second barrier walls 141 are connected to each other by the first elastic member 147. More specifically, a connecting member 146c is included in the cross-section of the sliding unit 146 and the first elastic member 147 connects the connecting member 146c to the second barrier walls 141. The first elastic member 147 which connects the sliding unit 146 to the second barrier walls 141 and extends the second barrier walls 141 so as to improve the flatness of the second barrier walls 141 may have various forms. That is, as illustrated in FIG. 8, the first elastic member 147 may be a folded flat type spring. Also, as illustrated in FIG. 9, the first elastic member 147 may be a ring type spring.

Figure 10:
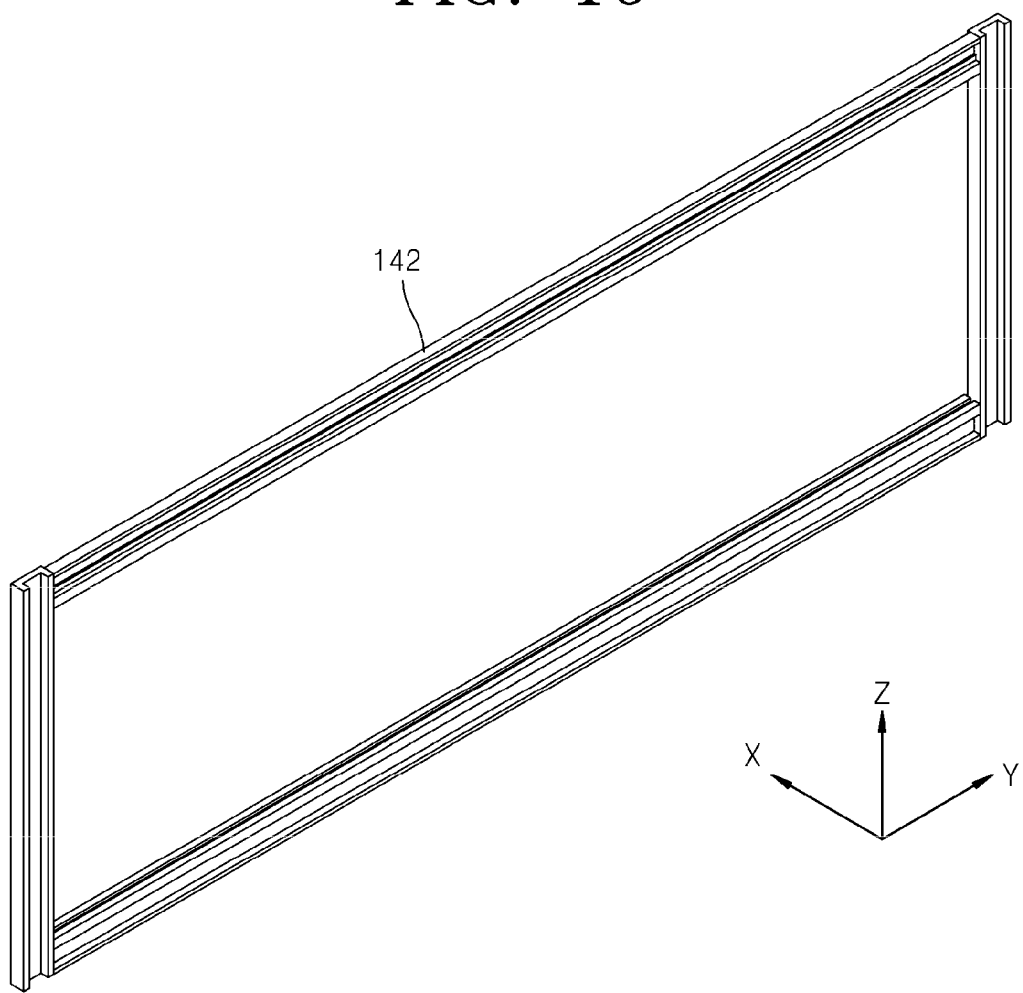
FIG. 10 is a perspective view of the second barrier wall frame of FIG. 5, according to an embodiment of the present invention.
Figure 11:
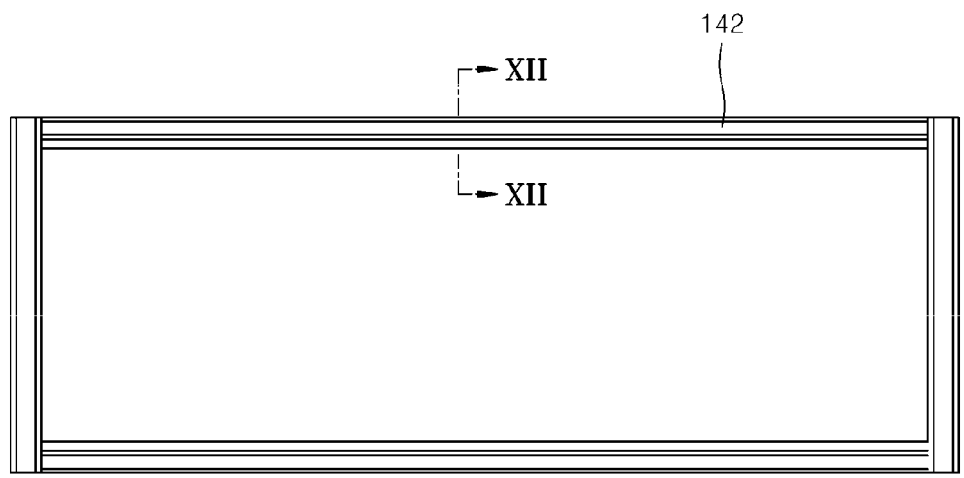
FIG. 11 is a front view of the second barrier wall frame of FIG. 5, according to an embodiment of the present invention.
Figure 12:
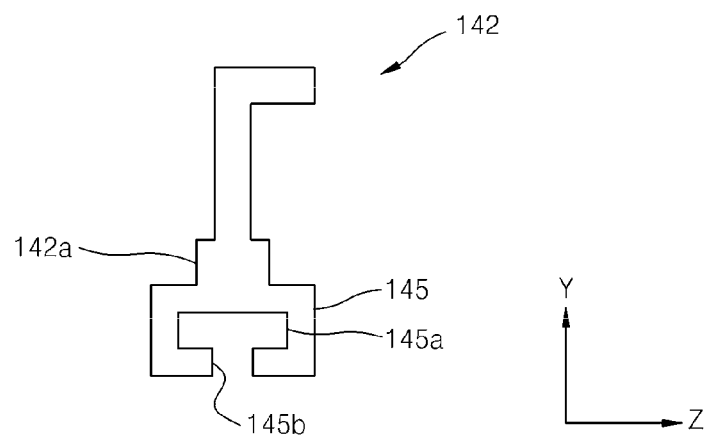
FIG. 12 is a cross-sectional view of the second barrier wall frame taken along a line XII-XII of FIG. 11, according to an embodiment of the present invention.

FIG. 10 is a perspective view of the second barrier wall frame 142 of FIG. 5; FIG. 11 is a front view of the second barrier wall frame 142; and FIG. 12 is a cross-sectional view of the second barrier wall frame 142 taken along the line XII-XII of FIG. 11, according to another embodiment of the present application.

The second barrier wall frame 142 has a shape corresponding to the second nozzle frame 155 and in this regard has a lattice shape that is similar to a window frame. The second barrier wall frame 142 supports the second barrier walls 141 and includes the slide guiding unit 145 so as to facilitate the slide movement of the second barrier walls 141. Also, the second barrier wall frame 142 is fixed to the second nozzle frame 155 while supporting the second barrier walls 141. The second barrier wall frame 142 includes a third contact surface 142a contacting the second nozzle frame 155. The third contact surface 142a is disposed to be close to the slide guiding unit 145. The third contact surface 142a is flat so as easily combine the second barrier wall frame 142 to the second nozzle frame 155.

Referring to FIG. 6, the second nozzle frame 155 includes a flat fourth contact surface 155a from among the surfaces contacting the second nozzle 150. A surface adjacent to the fourth contact surface 155a is an inclined surface 155b so that a gap h is generated between a line extending along and beyond the fourth contact surface 155a and the weld point 152.

The second nozzle 150 that combines with the second nozzle frame 155 may be flat for precise deposition of the deposition material 115 on the substrate 160. Since the second nozzle 150 is combined with the second nozzle frame 155, the flatness of the second nozzle 150 is significantly affected by the second nozzle frame 155. In particular, the flatness of the surface of the central area of the second nozzle 150, in which the second slit 151 is formed, is important.

The fourth contact surface 155a is near to the second slit 151 and contacts the second nozzle 150 based on the second slit 151. As the fourth contact surface 155a is formed to be flat, the flatness of the second nozzle 150 may be easily secured.

Also, the inclined surface 155b prevents the weld point 152 contacting the substrate 160 on which the deposition is performed during the deposition and thereby prevents the substrate 160 on which the deposition is performed.

The fourth contact surface 155a contacts the second nozzle 150 and is formed on the same plane as the second nozzle 150. In addition, the third contact surface 142a is formed in the second barrier wall frame 142 and is parallel to the longitudinal direction (Z-axis direction) of the second barrier walls 141. Also, the third contact surface 142a may be parallel to the fourth contact surface 155a. Accordingly, it is easy to arrange the second nozzle 150 and the second barrier walls 141 to be parallel to each other. Also, the second nozzle 150 may be spaced apart from the second barrier walls 141 by a predetermined gap g.

Figure 13:
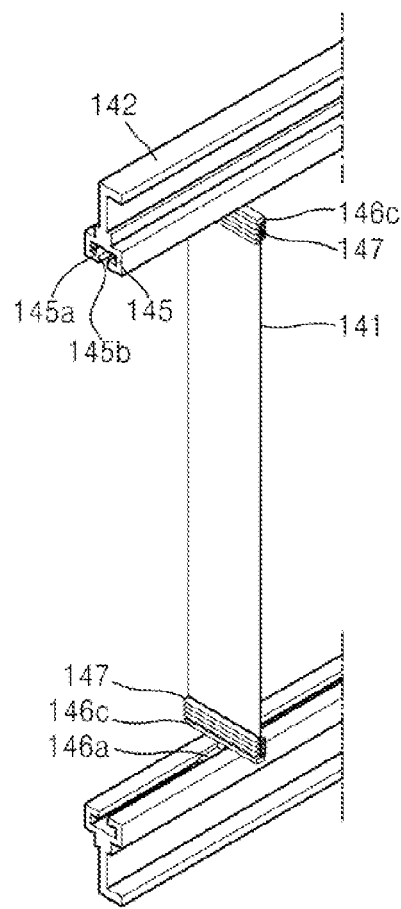
FIG. 13 is a perspective view partially illustrating the combination relationship between the second barrier wall frame of FIG. 5 and one second barrier wall, according to an embodiment of the present invention.
Figure 14:
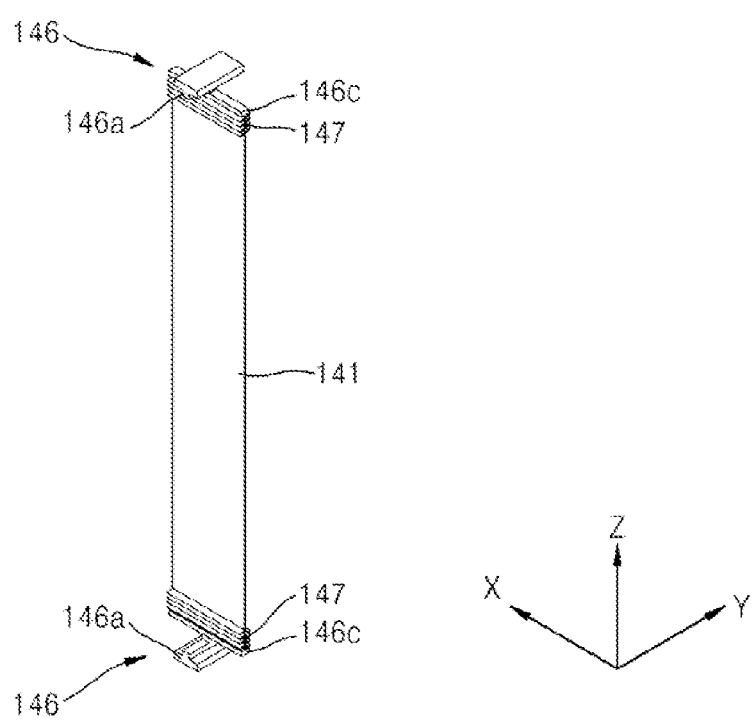
FIG. 14 is a perspective view of the second barrier wall of FIG. 5 and a sliding unit, according to an embodiment of the present invention.

FIG. 13 is a perspective view partially illustrating the combination relationship between the second barrier wall frame 142 of FIG. 5 and one second barrier wall 141; and FIG. 14 is a perspective view of the second barrier wall 142 of FIG. 5 and the sliding unit 146, according to embodiments of the present invention.

The protrusion 146a of the sliding unit 146 is formed to correspond to the slide guiding unit 145 of the second barrier wall frame 142 and may slide in the Y-axis direction of FIGS. 13 and 14. Also, the connecting member 146c of the sliding unit 146 is aligned with the second barrier wall 141 so that the connecting member 146c and the protrusion 146a are disposed to cross each other. The sliding units 146 are disposed at both ends of the second barrier wall 141 so that the second barrier wall 141 may move in parallel along the slide guiding unit 145. Here, in order to control minute movement of the second barrier wall 141, the micrometers 143 may be disposed as illustrated in FIG. 5.

Figure 15:
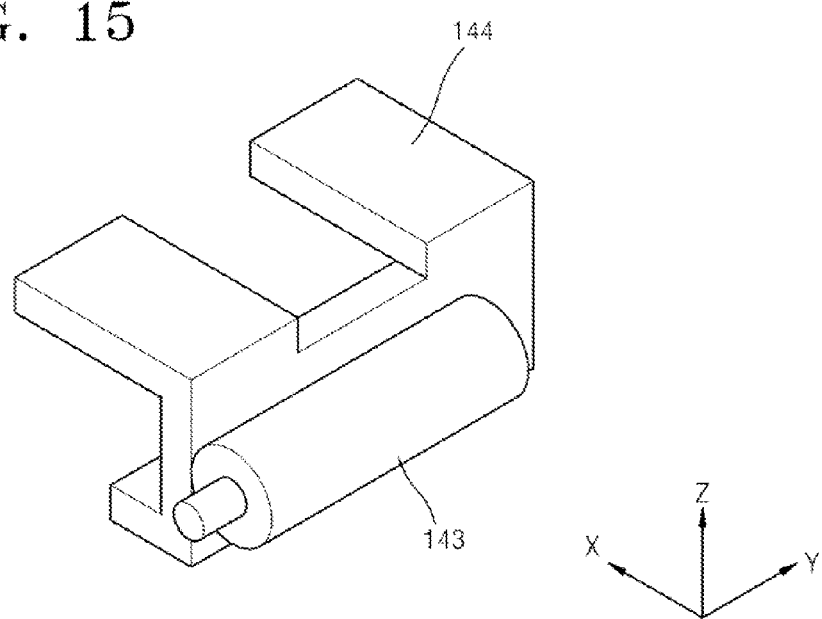
FIG. 15 is an enlarged perspective view of a micrometer of the second barrier wall frame of FIG. 5.
Figure 16:
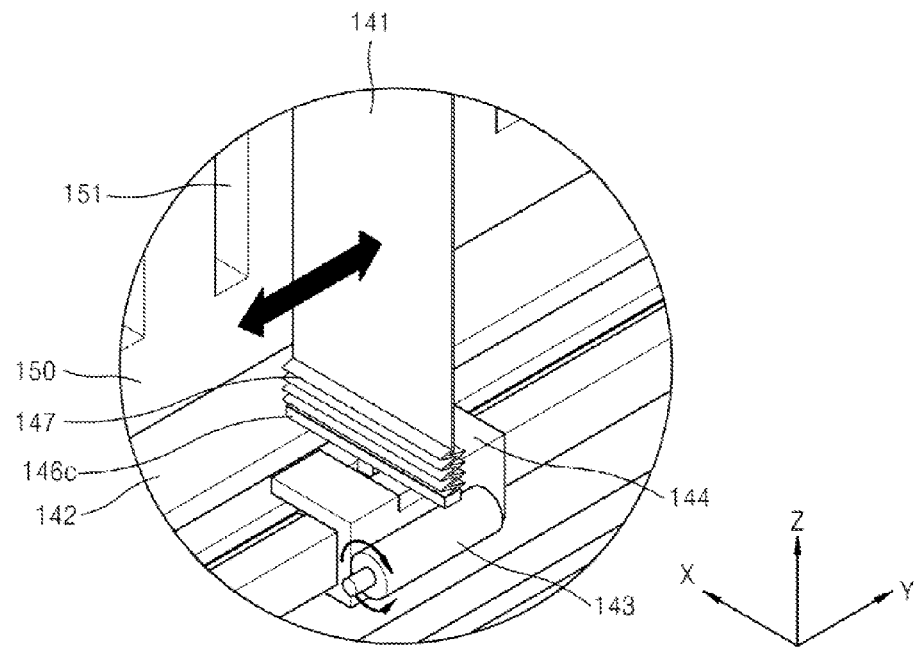
FIG. 16 is an enlarged view of A of FIG. 5, according to an embodiment of the present invention.

FIG. 15 is an enlarged perspective view of the micrometer 143 of FIG. 5; and FIG. 16 is an enlarged view of A of FIG. 5, according to embodiments of the present invention.

The micrometer 143 is connected to a jig 144 and the jig 144 is formed to be easily detachable from the second barrier wall frame 142. The micrometer 143 may be plural in number, so that there may be a micrometer 143 disposed at either end or at both ends of the second barrier wall 141. Also, the jig 144 is disposed to be combined to the second barrier wall frame 142 with each sliding unit 146 at the center. Referring to FIG. 16, the micrometer 143 moves the second barrier wall 141 and precisely controls the movement of the second barrier wall 141. That is, the micrometer 143 is controlled so that the second barrier wall 141 does not cover the second slit 151 of the second nozzle 150 and is disposed at an appropriate place.

Figure 17:
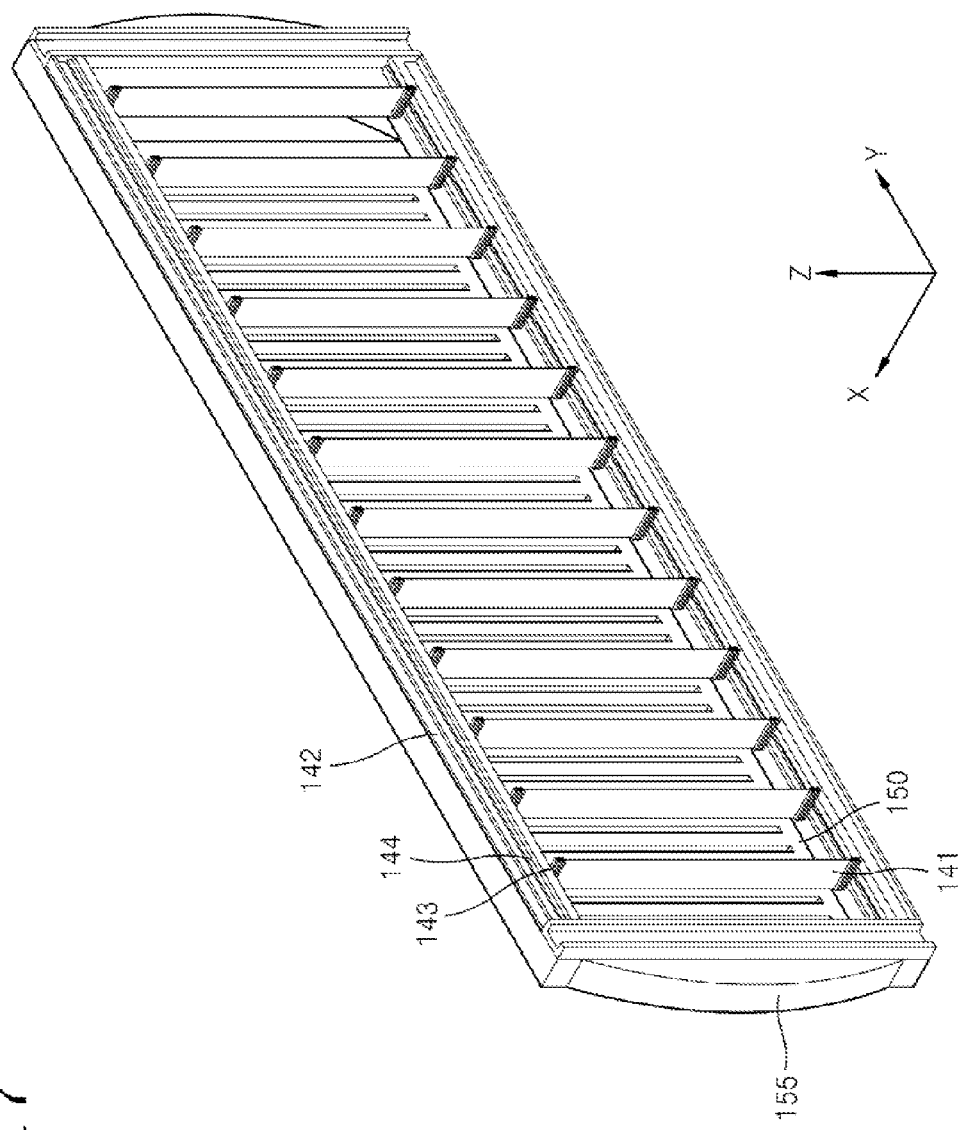
FIG. 17 is a perspective view of the second barrier wall and the second barrier wall frame in which the micrometer of FIG. 5 is removed, according to an embodiment of the present invention.

The micrometer 143 may be disposed on the second barrier wall frame 142 after the second barrier wall 141 is disposed at a desired place; however, as illustrated in FIG. 17, the micrometer 143 may be removed from the second barrier wall frame 142. Accordingly, the micrometer 143 may be prevented from being contaminated from the deposition material 115 during the deposition.

In the thin film deposition apparatus 100, the first barrier wall assembly 130 and the second barrier wall assembly 140 may be disposed to be spaced apart from each other by a predetermined interval. The first barrier wall assembly 130 and the second barrier wall assembly 140 are spaced apart from each other for the following reasons.

First, the second barrier wall 141 and the second nozzle 150 have to be precisely aligned to each other, whereas the first barrier wall 131 and the second barrier wall 141 do not need to be precisely aligned with each other. Thus, high-precision control may be easily achieved by separating a part required to be precisely controlled from a part not required to be precisely controlled.

Also, the second barrier wall 141 and the second nozzle 150 have to be precisely aligned with the substrate 160 and to have a constant gap therebetween, and thus require high-precision control. Accordingly, in order to reduce the weight of control parts, the deposition source 110, the first nozzle 120, and the first barrier wall assembly 130 which do not need to be precisely controlled and are heavy are separated from the second barrier wall assembly 140 and the second nozzle 150.

The temperature of the first barrier wall assembly 130 increases by a maximum of 100° C. due to the deposition source 110 whose temperature is relatively high. Thus, in order to prevent the heat of the first barrier wall assembly 130 from being conducted to the second barrier wall assembly 140 and the second nozzle 150, the first barrier wall assembly 130 and the second barrier wall assembly 140 are separated from each other.

When the second nozzle 150 is separated from the chamber (not illustrated), it is easier to separate the second nozzle 150 and the second barrier wall assembly 140 together than to separate the second nozzle 150 only. Accordingly, in order to separate the second barrier wall assembly 140 along with the second nozzle 150, the first barrier wall assembly 130 and the second barrier wall assembly 140 may be spaced apart from each other.

In the thin film deposition apparatus 100, the deposition material 115 attached to the first barrier wall assembly 130 is mainly recycled and the deposition material 115 attached to the second barrier wall assembly 140 and the second nozzle 150 may not be recycled. Accordingly, when the first barrier wall assembly 130 is separated from the second barrier wall assembly 140 and the second nozzle 150, recycling of the deposition material 115 is facilitated.

Also, in order to secure uniformity of a thin film formed on the substrate 160, a compensating plate (not illustrated) may be further included in the thin film deposition apparatus 100. When the first barrier wall assembly 130 is separated from the second barrier wall assembly 140, the compensating plate may be easily installed.

Finally, in order to increase a nozzle replacement cycle by preventing the deposition material 115 from being deposited on the second nozzle 150 after deposition onto the substrate 160 has been completed and before another target is subjected to deposition, a partition (not illustrated) may be further included in the thin film deposition apparatus 100. Here, the partition (not illustrated) may be easily installed between the first barrier wall 131 and the second barrier wall 141. Accordingly, the first barrier wall assembly 130 and the second barrier wall assembly 140 are spaced apart from each other.

Figure 18:
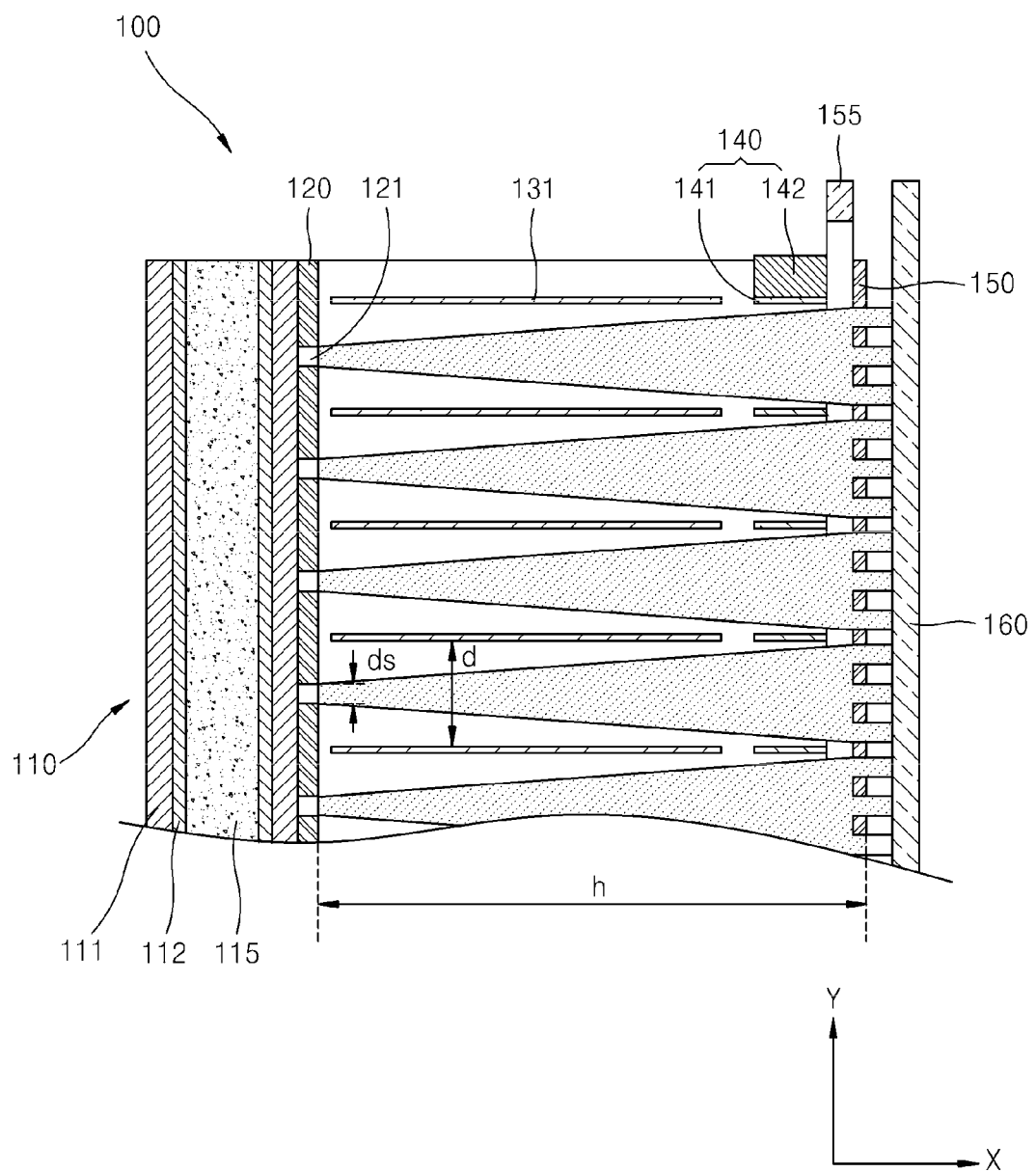
FIG. 18 is a schematic view illustrating deposition of deposition material in the thin film deposition apparatus of FIG. 1, according to an embodiment of the present invention.
Figure 19:
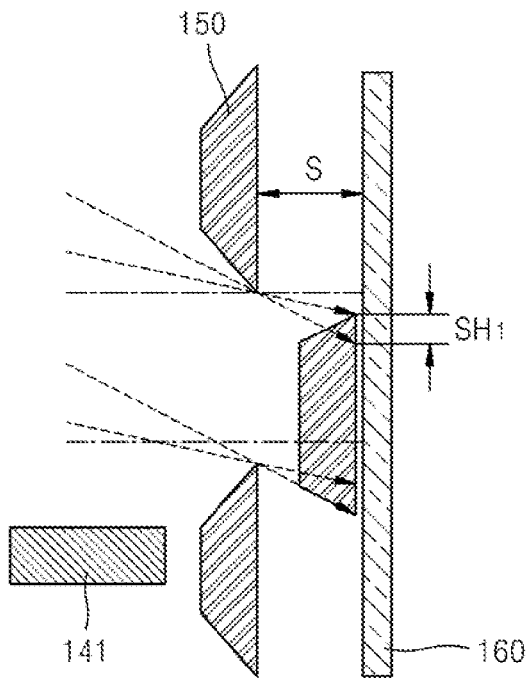
FIG. 19 illustrates shadows generated when a deposition space is partitioned by the first barrier walls and the second barrier walls of the thin film deposition apparatus of FIG. 1, according to an embodiment of the present invention.
Figure 20:
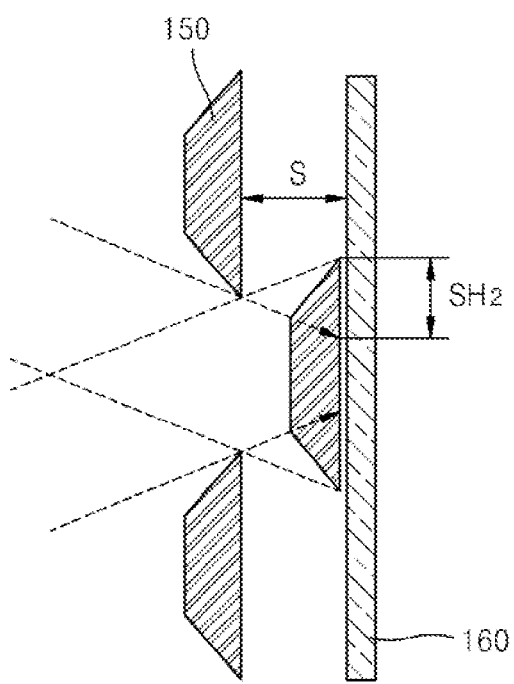
FIG. 20 illustrates shadows generated when a deposition space is not partitioned.

FIG. 18 is a schematic view illustrating deposition of the deposition material 115 in the thin film deposition apparatus 100, according to an embodiment of the present invention; FIG. 19 illustrates shadows generated when a deposition space is partitioned by the first barrier wall 131 and the second barrier wall 141, according to an embodiment of the present invention; and FIG. 20 illustrates shadows generated when a deposition space is not partitioned.

Referring to FIG. 18, the deposition material 115 vaporized in the deposition source 110 passes through the first nozzle 120 and the second nozzle 150 and is deposited on the substrate 160. The space between the first nozzle 120 and the second nozzle 150 is partitioned by the first barrier wall assembly 130 and the second barrier wall assembly 140. Thus, the deposition material 115 discharged from each of the first slits 121 of the first nozzle 120 is not mixed with other deposition material 15 discharged from the other first slits 120 due to the first barrier wall assembly 130 and the second barrier wall assembly 140.

When the space between the first nozzle 120 and the second nozzle 150 is separated by the first barrier wall assembly 130 and the second barrier wall assembly 140, the intervals between adjacent first barrier walls 131 and the intervals between the adjacent second barrier walls 141 are controlled so as to control the angle between the paths through which the deposition material 115 moves and the second nozzle 150. That is, as the intervals between adjacent first barrier walls 131 and the intervals between the adjacent second barrier walls 141 are reduced, the deposition material 115 passes through the second nozzle 150 at an angle almost perpendicular to the second nozzle 150 and is deposited on the substrate 160, as illustrated in FIG. 19. Also, as the intervals between adjacent first barrier walls 131 and the intervals between the adjacent second barrier walls 141 increase, the angle between the paths through which the deposition material 115 moves and the second nozzle 150 may be reduced. The width SH1 of a shadow generated on the substrate 160 is determined using Equation 1 below.

$$SH_1 = s*d_s/h \quad \text{[Equation 1]}$$

where s denotes a distance between the second nozzle 150 and the substrate 160, $d_s$ denotes a width of the first slits 121, and h denotes a distance between the deposition source 110 and the second nozzle 150.

Moreover, when the space between the first nozzle 120 and the second nozzle 150 is not partitioned by the first barrier wall assembly 130 and the second barrier wall assembly 140, the deposition material 115 passes through the second nozzle 150 at various angles in a wider range than that of in FIG. 19, as illustrated in FIG. 20. This is because the deposition material 115 discharged through the plurality of first slits 121, not just through a first slit 121 in a partitioned space, is deposited on the substrate 160 through the second slits 151. Thus, a width $SH_2$ of a shadow generated on the substrate 160 is greater than when barrier walls are included. The width $SH_2$ of the shadow generated on the substrate 160 is determined using Equation 2 below.

$$SH_2 = s*2d/h \quad \text{[Equation 2]}$$

Comparing Equation 1 and Equation 2, d (interval between adjacent first slits 121) is greater than $d_s$ (width of first slits 121) by few times to several times. Thus, when the space between the first nozzle 120 and the second nozzle 150 is partitioned by the first barrier wall assembly 130 and the second barrier wall assembly 140, the shadows are relatively small. In order to reduce the width $SH_2$ of the shadow generated on the substrate 160, (1) the interval between adjacent first slits 121 may be reduced (d is reduced), (2) the intervals between the second nozzle 150 and the substrate 160 may be reduced (s is reduced), and (3) the heights of the first barrier walls 131 and the second barrier walls 141 may increase (h is increased).

Accordingly, since the first barrier wall assembly 130 and the second barrier wall assembly 140 are included, the shadows generated on the substrate 160 are small and thus the second nozzle 150 may be spaced apart from the substrate 160.

More specifically, in the thin film deposition apparatus 100 according to an embodiment of the present invention, the second nozzle 150 is spaced apart from the substrate 160 by a predetermined interval. In other words, in the conventional FMM deposition method, a mask is closely adhered to the substrate and the deposition is performed in order not to generate shadows on the substrate. However, when the mask is closely adhered to the substrate, defects due to contact between the substrate and the mask may occur. Accordingly, in the thin film deposition apparatus 100 according to an embodiment of the present invention, the second nozzle 150 is spaced apart from the substrate 160, on which the deposition is performed, by a predetermined interval. Since the first barrier wall assembly 130 and the second barrier wall assembly 140 are included, the width of shadows generated on the substrate 160 may be relatively small.

Accordingly, defects due to contact between a substrate and a mask may be prevented. Also, time required to closely adhere the mask to the substrate is not needed and thus the manufacturing process may be shorter.

Figure 21:
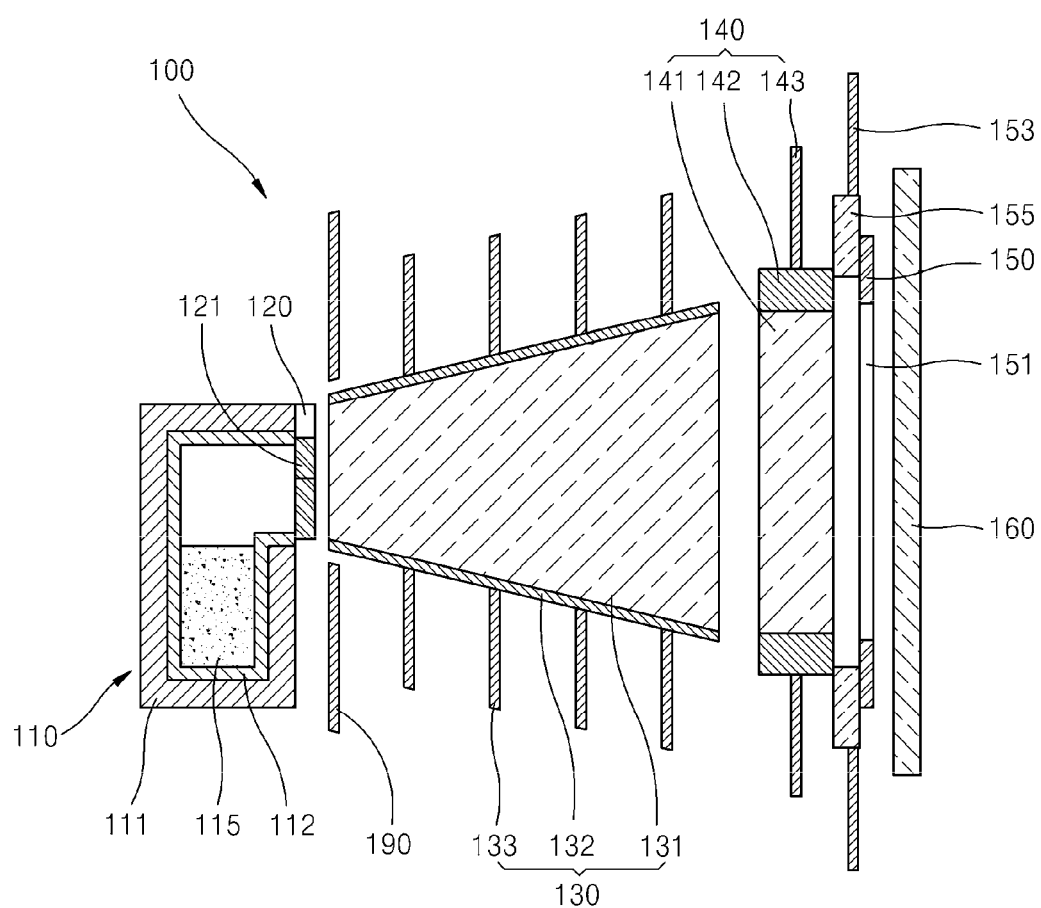
FIG. 21 is a side sectional view of a thin film deposition apparatus including cooling members, according to another embodiment of the present invention.

FIG. 21 is a side sectional view of a thin film deposition apparatus 100 including cooling members, according to another embodiment of the present invention. The thin film deposition apparatus 100 of FIG. 21 is substantially similar to the thin film deposition apparatus 100 of FIGS. 1 and 2, and thus descriptions of elements common to both apparatuses will not be repeated.

Referring to FIG. 21, the first barrier wall assembly 130 and the second barrier wall assembly 140 may respectively include a first cooling member 133 and a second cooling member 143. This is because the first barrier wall assembly 130 and the second barrier wall assembly 140 have to be maintained at a significantly lower temperature than that of the deposition source 110. Thus, the first cooling member 133 and the second cooling member 143 are included to respectively cool the first barrier wall assembly 130 and the second barrier wall assembly 140. Therefore, the first cooling member 133 and the second cooling member 143 may include cooling fins. The cooling fins of the first cooling member 133 protrude from the outer surface of the first barrier wall frame 132 and cool the first barrier wall assembly 130. The cooling fins of the second cooling member 143 protrude from the outer surface of the second barrier wall frame 142 and cool the first barrier wall assembly 130. Also, although not illustrated in FIG. 21, pipes may be installed in the first barrier wall assembly 130 and the second barrier wall assembly 140 and a water cooling method whereby a cooling agent flows through the pipes may be used.

Moreover, a radiation fin 153 may be included in the thin film deposition apparatus 100 of FIG. 21, wherein the radiation fin 153 protrudes from the second nozzle frame 155. Also, a thermal shield 190 may be further included between the deposition source 110 and the second nozzle frame 155.

The second nozzle frame 155 does not directly face the deposition source 110 in a vacuum state and thus is not affected by radiation heat. Also, since the second nozzle frame 155 is not connected to the deposition source 110 and thus there is no heat conduction between the deposition source 110 and the second nozzle frame 155, the temperature of the second nozzle frame 155 is hardly increased. However, the temperature of the second nozzle frame 155 may increase by about 1-3° C. Thus, to prevent the temperature increase, the radiation fin 153 is further included to maintain the second nozzle frame 155 at a constant temperature. The radiation fin 153 protrudes from the outer surface of the second nozzle frame 155 and cools the second nozzle frame 155. In addition, the heat radiated from the deposition source 110 towards the second nozzle frame 155 may be blocked by installing the thermal shield 190 between the deposition source 110 and the second nozzle frame 55, so that the temperature of the second nozzle frame 155 may be maintained constant. The thin film apparatuses 100 according to an embodiment of the present invention may be used to form thin films for use in various devices such as organic light emitting devices (OLEDs).

FIGS. 22 to 26 sequentially illustrate a method of manufacturing an OLED, according to an embodiment of the present invention.

Figure 22:
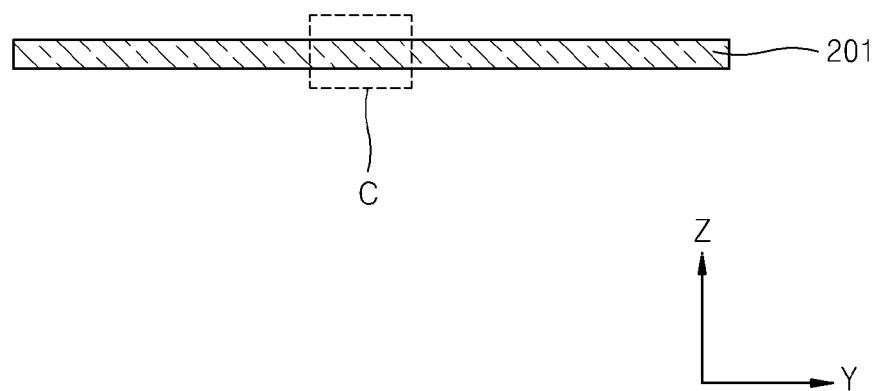
FIGS. 22 through 26 sequentially illustrate a method of manufacturing an organic light emitting device (OLED), according to an embodiment of the present invention.
Figure 23:
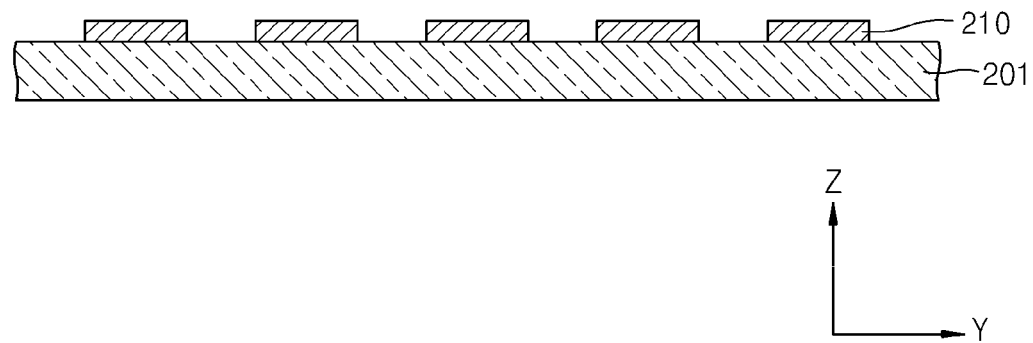

FIG. 23 is an enlarged view of C of FIG. 22. Referring to FIGS. 22 and 23, a substrate 201 on which first electrodes 210 are formed is prepared.

The substrate 201 may be formed of a transparent glass material mainly formed of $SiO_2$. The substrate 201 is not limited thereto and may be formed of a transparent plastic material. A plastic substrate may be formed of an organic insulating material. The organic insulating material may include one selected from the group consisting of polyethersulphone (PES), polyacrylate (PAR), polyetherimide (PEI), polyethyelenen napthalate (PEN), polyethyeleneterepthalate (PET), polyphenylene sulfide (PPS), polyallylate, polyimide, polycarbonate (PC), cellulose triacetate (TAC), and cellulose acetate propionate (CAP).

Also, the substrate 201 may be formed of a metal. When the substrate 201 is formed of a metal, the substrate 201 may include at least one selected from the group consisting of iron, chrome, manganese, nickel, titanium, molybdenum, stainless steel (SUS), an Invar alloy, an Inconel alloy, and a Kovar alloy. However, the substrate 201 is not limited thereto and may be a foil type substrate. In order to improve planarity of the substrate 201 and to prevent penetration of impurity elements, a buffer layer (not illustrated) may be formed on the substrate 201. The buffer layer (not illustrated) may be formed of $SiO_2$ and/or SiNx.

The first electrodes 210 are formed on the substrate 201. The first electrodes 210 may be formed in a predetermined pattern by using a photolithographic method. In a passive matrix (PM) type OLED, the first electrodes 210 may be spaced apart from each other in stripe lines and in an active matrix (AM) type OLED, the first electrodes 210 may be formed to correspond to pixels.

The first electrodes 210 may be reflective type electrodes or transmissive type electrodes. If the first electrodes 210 are reflective type electrodes, a reflective film formed of silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or a compound thereof may be formed, and then an indium-doped thin oxide (ITO), an Indium zinc oxide (IZO), a zinc oxide (ZnO), or an indium (III) oxide ($In_2O_3$) having a high work function is deposited on the reflective film, thereby completing the manufacture of the first electrodes 210.

If the first electrodes 210 are transmissive type electrodes, the first electrodes 210 may be formed of ITO, IZO, ZnO, or $In_2O_3$ having a high work function.

Figure 24:
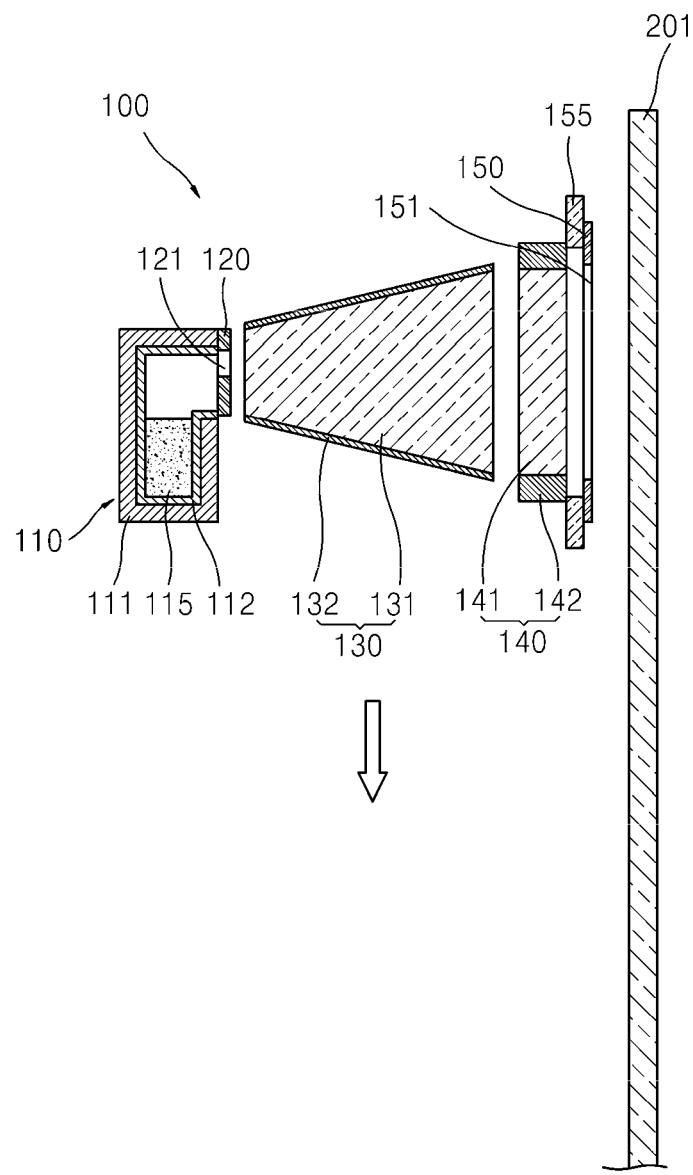
Figure 25:
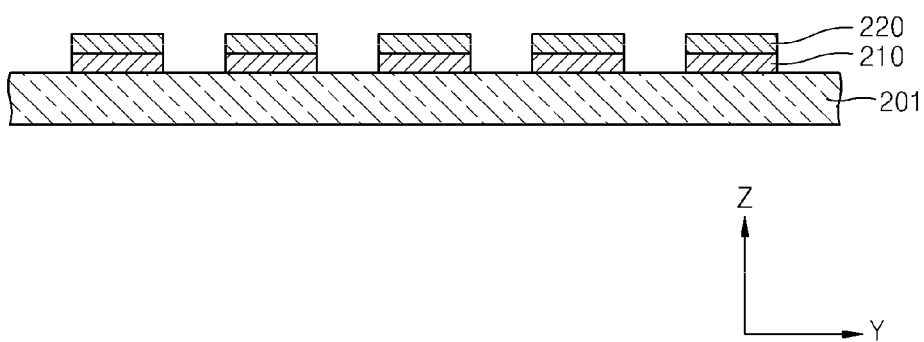

Then, referring to FIGS. 24 and 25, intermediate layers 220 are respectively formed on the first electrodes 210 by using the thin film deposition apparatus 100. The intermediate layers 220 may include an organic emitting layer emitting visible light, and an electron transport layer, an electron injection layer, and an electron barrier layer.

The thin film deposition apparatus 100 moves in the Z-axis direction as illustrated in FIG. 24 and continuously performs the deposition. Here, the width of the thin film deposition apparatus 100 may be the same as the width of the substrate 201 in the same direction. More specifically, the width of the second nozzle 150 in the thin film deposition apparatus 100 may be the same as the width of the substrate 201 in the same direction.

That is, the widths of the thin film deposition apparatus 100 and the substrate 201 may correspond to each other in the Z-axis direction in FIG. 24. Thus, when the deposition is performed while the thin film deposition apparatus 100 moves in the Z-axis direction, that is, from the top to the bottom of the substrate 201, a desired deposition pattern is formed on the substrate 201. Also, the intermediate layers 220 may be formed while the thin film deposition apparatus 100 is fixed and the substrate 201 continuously moves in the Z-axis direction. Also, the intermediate layers 220 may be formed while the thin film deposition apparatus 100 is spaced apart from the substrate 201 by a predetermined interval.

The thin film deposition apparatus 100 may form an intermediate layer 220 that corresponds to one color during a single deposition process. That is, deposition materials for forming the intermediate layer 220 that corresponds to a red pixel is filled in the deposition source 110 of the thin film deposition apparatus 100 and then the thin film deposition apparatus 100 continuously moves in the Z-axis direction, as illustrated in FIG. 24, thereby forming the intermediate layer 220 that corresponds to a red pixel in a single deposition process. Then, the intermediate layers 220 that correspond to blue and green pixels are sequentially formed.

However, an aspect of the present invention is not limited thereto and materials for forming the intermediate layers 220 that correspond to red, blue, and green pixels are respectively filled in the deposition source 110. Then, the intermediate layers 220 that correspond to red, blue, and green pixels may be simultaneously formed in a single deposition process.

According to the processes described above, the intermediate layers 220 are formed on the first electrodes 210 as illustrated in FIG. 25. For convenience of description, the first electrodes 210 and the intermediate layers 220 are only illustrated in FIG. 25; however, other members such as insulating layers may be further formed.

The intermediate layers 220 may be formed of low molecular organic materials or polymer organic materials.

If the intermediate layers 220 are formed of low molecular organic materials, a hole transport layer and a hole injection layer are formed in a direction of the first electrodes 210 along with the organic emitting layer (not illustrated) and an electron transport layer and an electron injection layer are formed in a direction opposite to the first electrodes 210.

In addition, other various layers may be formed, if needed. The usable organic materials may include copper phthalocyanine (CuPc), N,N'-Di(naphthalene-1-yl)-N,N'-diphenyl-benzidine (NPB), tris-8-hydroxyquinoline aluminum (Alq3), and the like.

If the intermediate layers 220 are formed of polymer organic materials, only a hole transport layer (HTL) may be formed in a direction of the first electrodes 210 along with the organic emitting layer (not illustrated). The polymer HTL may be formed of poly-(2,4)-ethylene-dihydroxy thiophene (PEDOT) or polyaniline (PANI).

Figure 26:
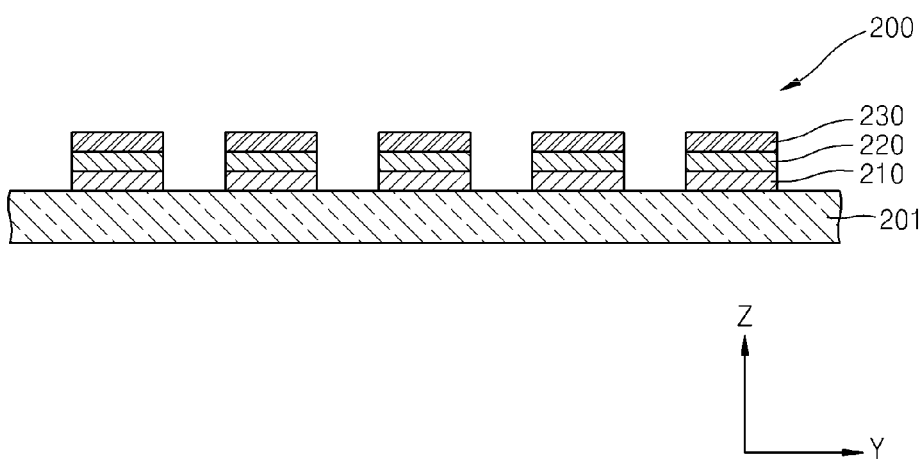

Then, referring to FIG. 26, second electrodes 230 are respectively formed on the intermediate layers 220, thereby completing the manufacture of an OLED 200.

If the OLED 200 is a PM type OLED, the second electrodes may have a stripe form orthogonal to the pattern of the first electrodes 210. If the OLED 200 is an AM type OLED, the second electrodes 230 may be formed throughout an active region on which an image is realized.

The second electrodes 230 may be transmissive type electrodes or reflective type electrodes. If the second electrodes 230 are transmissive type electrodes, the second electrodes 230 may be formed by depositing a metal having a low work function, that is, Ag, Mg, Al, Pt, Pd, Au, Ni, Nd, Ir, Cr, Li, Ca or a compound thereof and then forming an auxiliary electrode layer or a bus electrode line by using a transparent conductive material such as ITO, IZO, ZnO, or $In_2O_3$ on the metal.

If the second electrodes 230 are reflective type electrodes, the second electrodes 230 may be formed of a metal having a low work function such as Ag, Mg, Al, Pt, Pd, Au, Ni, Nd, Ir, Cr, Li, or Ca. The first electrodes 210 and the second electrodes 230 described above may be respectively denoted as anode electrodes and cathode electrodes; or vice versa.

A sealing member (not illustrated) may be disposed to face one surface of the substrate 201. The sealing member (not illustrated) is formed to protect the OLED 200 from external moisture or oxygen and may be formed of a transparent material. Thus, the sealing member (not illustrated) may have a stacked structure of glass and plastic or organic materials and inorganic materials.

In the thin film deposition apparatus according to an aspect of the present invention, a precise pattern may be formed on a large-sized substrate. Also, a precise thin film pattern of an OLED may be easily formed by using the thin film deposition apparatus according to aspects of the present invention.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. A method of manufacturing an organic light emitting device (OLED) by using a thin film deposition apparatus comprising: a deposition source; a first nozzle in which a plurality of first slits are formed in one direction, the first nozzle being disposed at one side of the deposition source; a second nozzle in which a plurality of second slits are formed in the one direction, the second nozzle being disposed to face the deposition source; a second nozzle frame combined with the second nozzle in order to support the second nozzle; a first barrier wall assembly comprising a plurality of first barrier walls disposed in the one direction so as to partition a space between the first nozzle and the second nozzle; and a second barrier wall assembly comprising a plurality of second barrier walls disposed in the one direction and a second barrier wall frame combined with the second barrier walls in order to support the second barrier walls, the second barrier wall assembly being disposed at one side of the first barrier wall assembly, the method comprising:
    preparing a substrate on which first electrodes are formed;
    forming an intermediate layer comprising an organic light emitting layer using the thin film deposition apparatus by vapor depositing a deposition material from the deposition source onto the substrate through the first slits and the second slits, so that the intermediate layer is connected to the first electrodes formed on the substrate; and
    forming second electrodes on the intermediate layer.

2. The method of claim 1, wherein the thin film deposition apparatus continuously moves in a direction perpendicular to the one direction so as to form the intermediate layer.

3. The method of claim 1, wherein the forming of the intermediate layer is performed while the second nozzle of the thin film deposition apparatus is spaced apart from the substrate by a predetermined interval.

4. The method of claim 1, wherein a width of the second nozzle of the thin film deposition apparatus in the one direction is substantially the same as a width of the substrate in the one direction.

5. The method of claim 1, wherein the deposition source includes deposition materials which are used to form the first electrodes, the intermediate layer and the second electrodes.

6. A method of manufacturing an organic light emitting device (OLED) by using a thin film deposition apparatus comprising: a deposition source; a first nozzle in which a plurality of first slits are formed in one direction, the first nozzle being disposed at one side of the deposition source; a second nozzle in which a plurality of second slits are formed in the one direction, the second nozzle being disposed to face the deposition source; a second nozzle frame combined with the second nozzle in order to support the second nozzle; a first barrier wall assembly comprising a plurality of first barrier walls disposed in the one direction so as to partition a space between the first nozzle and the second nozzle; and a second barrier wall assembly comprising a plurality of second barrier walls disposed in the one direction and a second barrier wall frame combined with the second barrier walls in order to support the second barrier walls, the second barrier wall assembly being disposed at one side of the first barrier wall assembly, the method comprising:

preparing a substrate on which first electrodes are formed;

forming an intermediate layer comprising an organic light emitting layer using the thin film deposition apparatus, so that the intermediate layer is connected to the first electrodes formed on the substrate; and forming second electrodes on the intermediate layer, wherein the deposition source includes deposition materials which are used to form the first electrodes, the intermediate layer and the second electrodes, and wherein remaining deposition materials used to form the first electrodes, the intermediate layer and the second electrodes are collected on the first barrier wall assembly and the first barrier wall assembly is detached from the thin film deposition apparatus and the remaining deposition materials are recycled.

7. A method of manufacturing an organic light emitting device (OLED) by using a thin film deposition apparatus comprising: a deposition source; a first nozzle in which a plurality of first slits are formed in one direction, the first nozzle being disposed at one side of the deposition source; a second nozzle in which a plurality of second slits are formed in the one direction, the second nozzle being between the first nozzle and the substrate; and a second nozzle frame combined with the second nozzle in order to support the second nozzle, the method comprising:

preparing a substrate on which first electrodes are formed, the substrate being larger than the second nozzle in a direction perpendicular to the one direction;

forming an intermediate layer comprising an organic light emitting layer using the thin film deposition apparatus, while the substrate is spaced apart from the thin film deposition apparatus and the substrate and the thin film deposition apparatus are continuously being moved with respect to each other in the direction perpendicular to the one direction, by vapor depositing a deposition material from the deposition source onto the substrate through the first slits and the second slits, so that the intermediate layer is connected to the first electrodes formed on the substrate; and forming second electrodes on the intermediate layer.

8. The method of claim 7, wherein the first electrodes are formed on the substrate by vapor depositing another deposition material onto the substrate through the first slits and the second slits.

9. The method of claim 7, wherein said forming the second electrodes on the intermediate layer comprises vapor depositing another deposition material on the intermediate layer through the first slits and the second slits.

* * * * *